United States Patent
Kudo et al.

(10) Patent No.: US 7,163,887 B2
(45) Date of Patent: Jan. 16, 2007

(54) METHOD FOR FABRICATING A SEMICONDUCTOR DEVICE

(75) Inventors: Hiroshi Kudo, Kawasaki (JP); Koichiro Inazawa, Nirasaki (JP)

(73) Assignees: Fujitsu Limited, Kawasaki (JP); Tokyo Electron Limited, Tokyo (JP)

( * ) Notice: Subject to any disclaimer, the term of this patent is extended or adjusted under 35 U.S.C. 154(b) by 155 days.

(21) Appl. No.: 10/924,847

(22) Filed: Aug. 25, 2004

(65) Prior Publication Data

US 2005/0020057 A1 Jan. 27, 2005

Related U.S. Application Data

(63) Continuation of application No. PCT/JP03/00691, filed on Jan. 24, 2003.

(30) Foreign Application Priority Data

Feb. 28, 2002 (JP) ............................. 2002-054304

(51) Int. Cl.
*H01L 21/4763* (2006.01)
(52) U.S. Cl. ...................... 438/622; 438/629
(58) Field of Classification Search ............... 438/622, 438/623, 637, 638, 666, 668, 629, 675
See application file for complete search history.

(56) References Cited

U.S. PATENT DOCUMENTS 6,620,727 B1 * 9/2003 Brennan .................. 438/637
6,812,131 B1 * 11/2004 Kennedy et al. .......... 438/623
2001/0002331 A1 5/2001 Miyata
2002/0025670 A1 2/2002 Miyata

FOREIGN PATENT DOCUMENTS

| JP | 11-186391 | 7/1999 |
|---|---|---|
| JP | 2000-150519 | 5/2000 |
| JP | 2000-299376 | 10/2000 |
| JP | 2001-156170 | 6/2001 |
| JP | 2002-026122 | 1/2002 |
| JP | 2003-023072 | 1/2003 |
| JP | 2003-031652 | 1/2003 |

* cited by examiner

*Primary Examiner*—Kevin M. Picardat
(74) *Attorney, Agent, or Firm*—Westerman, Hattori, Daniels & Adrian, LLP.

(57) ABSTRACT

A method for fabricating a semiconductor device that prevents the occurrence of bowing and thickness reduction in a dual damascene method. As shown in FIG. 2(B), silicon nitride etching is performed on a semiconductor device in process of fabrication which has a section shown in FIG. 2(A). As a result, part of a copper film is oxidized and changes into oxide. Moreover, a $CF_x$ deposit is formed on it. By performing organic insulating film etching by the use of hydrogen plasma in FIG. 2(C), however, the oxide is deoxidized to copper and the $CF_x$ deposit is converted into a volatile compound and is removed.

22 Claims, 25 Drawing Sheets

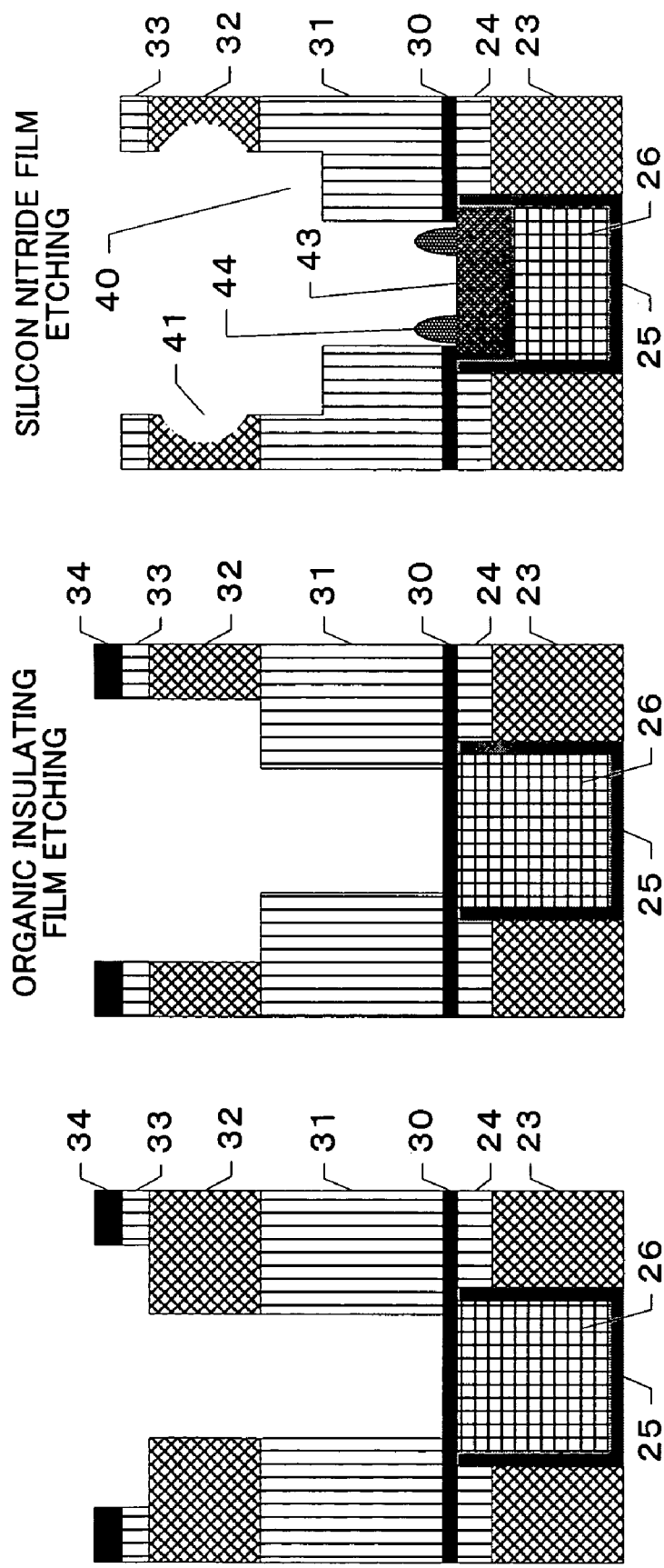

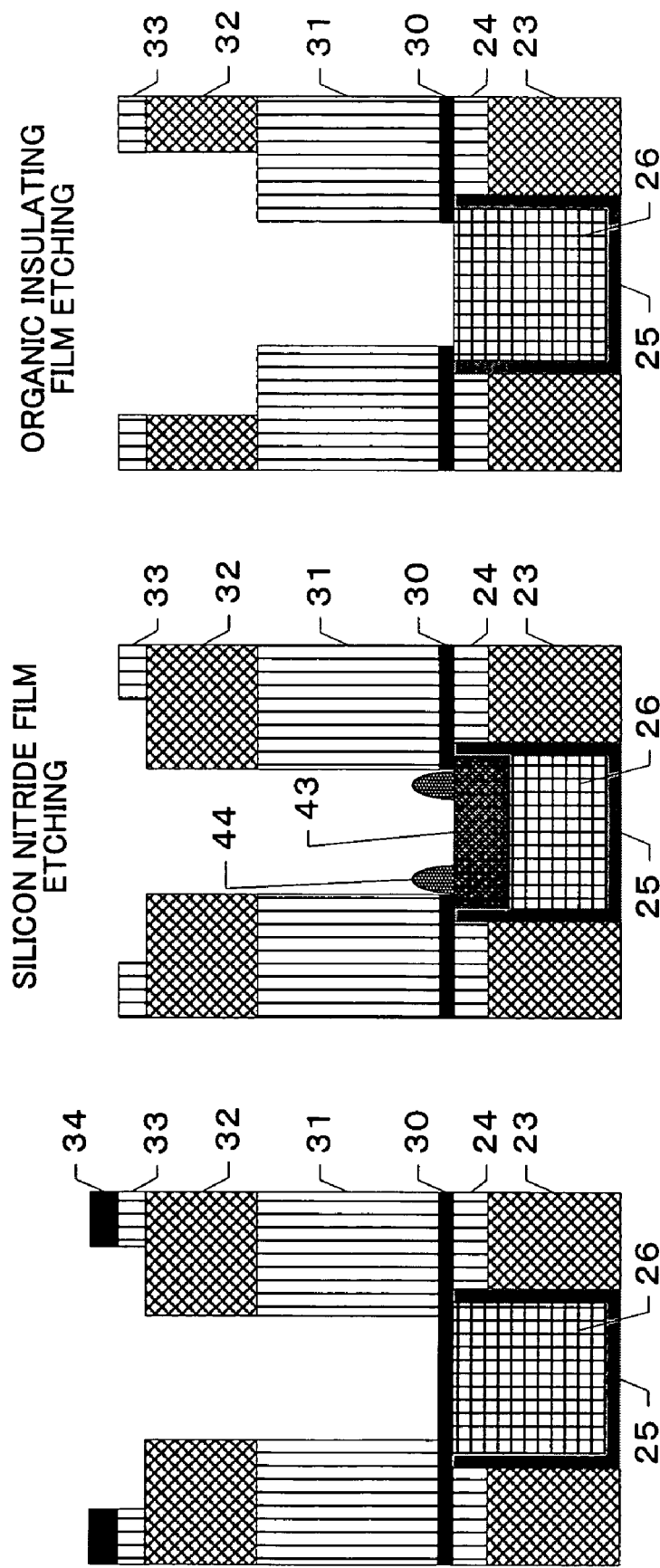

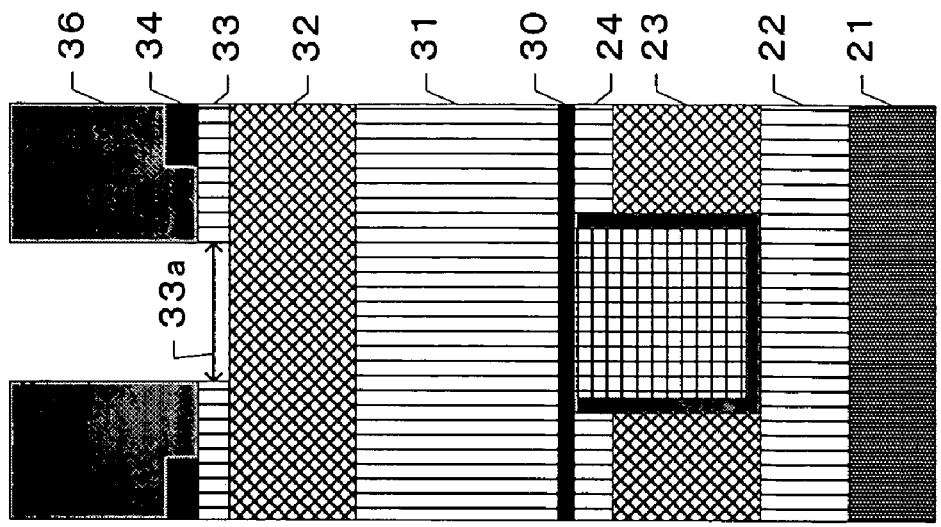
FIG. 12(F) *PRIOR ART*
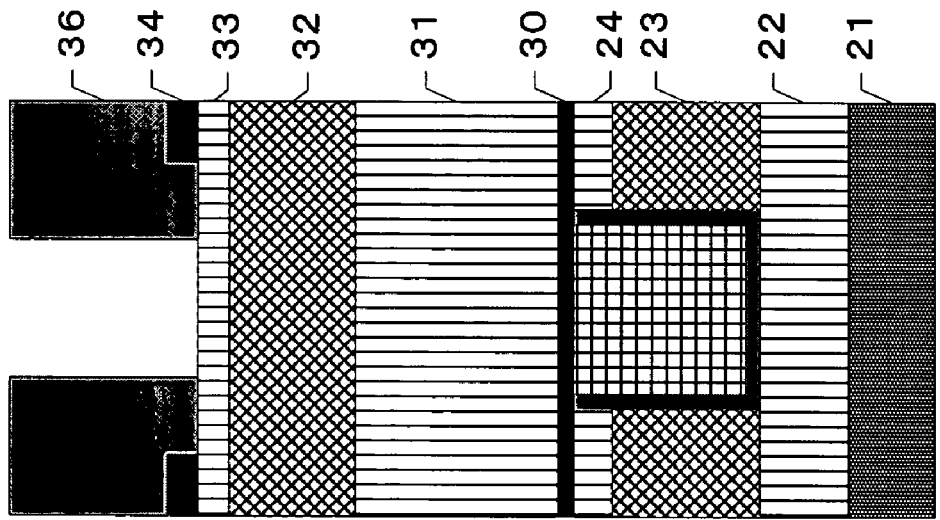
FIG. 12(E) *PRIOR ART*
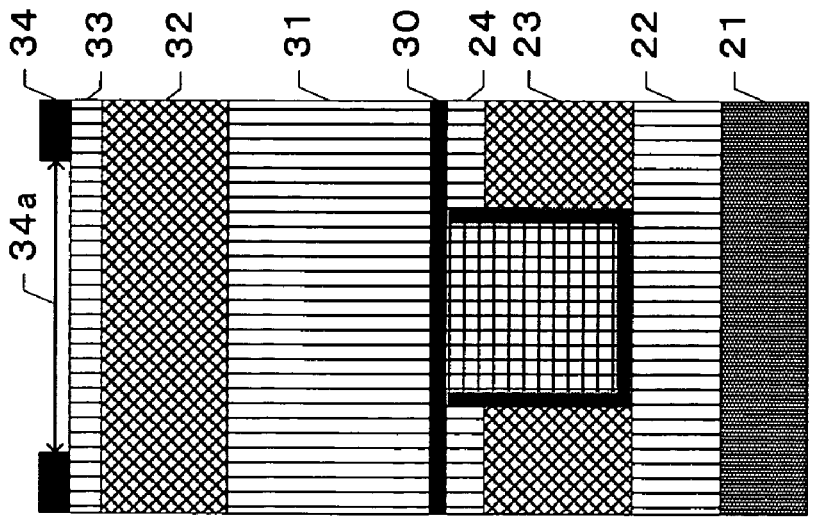
FIG. 12(D) *PRIOR ART*

METHOD FOR FABRICATING A SEMICONDUCTOR DEVICE

This application is a continuing application, filed under 35 U.S.C. §111(a), of International Application PCT/JP03/00691, filed on Jan. 24, 2003, it being further noted that priority is based upon Japanese Patent Application No. 2002-054304, filed on Feb. 28, 2002.

BACKGROUND OF THE INVENTION (1) Field of the Invention

This invention relates to a method for fabricating a semiconductor device and, more particularly, to a method for fabricating a semiconductor device including a process for forming wiring layers and vias in a multi-layer wiring structure by a dual damascene method.

(2) Description of the Related Art

Minute semiconductor devices have been produced in recent years. The minuter semiconductor devices become, the narrower wiring width and a space between wirings become. Accordingly, wiring resistance and parasitic capacitance between wirings increase. This will reduce signal speed and prevent semiconductor devices from operating at high speeds according to the scaling law.

In order to decrease wiring resistance and parasitic capacitance between wirings, methods for forming multi-layer wirings, an insulating material, and a metal wiring material must be reviewed. Insulating materials with a small dielectric constant are effective in decreasing wiring capacitance. Moreover, to decrease wiring resistance, a metal wiring material is shifting from aluminum to copper with low resistivity.

It is difficult to apply the conventional dry etching to the processing of copper films, so damascene methods are used. These damascene methods are divided broadly into a single damascene method and a dual damascene method. With the single damascene method, plugs (vias) which connect a lower wiring and an upper wiring and wirings are formed by different processes. With the dual damascene method, plugs and wirings are formed at one time.

The minuter semiconductor devices become, the greater the number of wiring layers in them becomes. For example, the number of wiring layers in semiconductor devices manufactured in accordance with the design rule of 0.18 μm is six. In this case, similar processes are repeated, for example, twelve times (six times for forming wirings and six times for forming plugs) in the single damascene method. On the other hand, similar processes are repeated only six times in the dual damascene method.

As described above, wirings and plugs can be formed at one time in the dual damascene method. As a result, the number of processes performed in the dual damascene method is half of that of processes performed in the single damascene method. Therefore, to lower production costs and improve production efficiency, it is advantageous to adopt the dual damascene method. Furthermore, with the dual damascene method, contact resistance between a lower wiring and a plug connected thereto is low and it is easy to avoid bad contact between them. As a result, the reliability of wirings will improve.

FIGS. 12(A) to 12(M) shows a process for fabricating a semiconductor device using a conventional dual damascene method. A plurality of films, such as insulating and metal films, are formed first on a lower wiring layer according to FIGS. 12A through 12C. The lower wiring layer is formed in the following way.

First, a silicon dioxide film ($SiO_2$ film) 22, an organic insulating film 23, and a silicon dioxide film 24 are formed on a silicon substrate 21. In this case, the silicon dioxide film 22 with a thickness of 200 nm and the silicon dioxide film 24 with a thickness of 100 nm are formed by a plasma CVD method.

The organic insulating film 23 with a thickness of 400 nm is formed by the use of, for example, Allied-Signal's FLARE 2.0, being an insulating material having a low dielectric constant, by a spin coat method. Allied-Signal's FLARE 2.0 is an aromatic polymer with a dielectric constant of 2.8 lower than 4.1, being the dielectric constant of a silicon dioxide film, and can withstand temperatures higher than 400° C. In this example, Allied-Signal's FLARE 2.0 is used for forming the organic insulating film 23. However, Dow Chemical's SiLK, being a hydrocarbonaceous polymer, or the like can be used. Another substance, such as resin which contains hydrocarbon or fluorine or silicon oxycarbide, may be used for forming the organic insulating film 23.

To form a first wiring layer in the organic insulating film 23 and the silicon dioxide film 24 formed in this way, first the silicon dioxide film 24 is coated with a photoresist film, being a photosensitive polymer, and a window for a wiring pattern is formed through exposure and development. An opening of a wiring shaped pattern is made in the silicon dioxide film 24 through this window by etching using, for example, a plasma etching method. Then a portion of the organic insulating film 23 which is exposed from the opening for a wiring in the silicon dioxide film 24 is removed by the plasma etching method to make an opening of a wiring shaped pattern. The organic insulating film 23 is etched in an atmosphere where $O_2$ gas and Ar gas are introduced. An etchant used in this example is oxygen, so the organic insulating film 23 and photoresist film are etched selectively in relation to the silicon dioxide films 22 and 24 and the silicon dioxide film 24 is not etched. However, the photoresist film is etched by oxygen, so the etching of the organic insulating film 23 and the removal of the photoresist film can be performed at one time.

A wiring trench in the first wiring layer consists of the opening in the silicon dioxide film 24 and the opening in the organic insulating film 23 formed through the above patterning process. The opening in the organic insulating film 23 is right beneath the opening in the silicon dioxide film 24.

Next, a barrier metal film 25 of TiN or TaN, the melting point of which is high, with a thickness of 50 nm is formed by sputtering on the inner surface of the wiring trench formed in this way and the surface of the silicon dioxide film 24 and then a copper (Cu) film 26 with a thickness of 800 nm is formed in the same way on the barrier metal film 25 by sputtering.

There will be irregularities on the surface of the copper film 26. Therefore, to flatten the surface of the copper film 26, anneal treatment is performed on the copper film 26 at 400° C. in an atmosphere of hydrogen at a pressure of 0.1 torr for five minutes. As a result of this anneal treatment, the copper film 26 will completely be buried in the wiring trench.

Then the copper film 26 is polished by a chemical mechanical polishing (CMP) method to leave the copper film 26 only in the wiring trench. This copper film 26 is the first wiring layer.

By performing the above process, a structure shown in FIG. 12(A) will be obtained.

Subsequently, as shown in FIG. 12(B), a plurality of films, such as insulating films and metal films, described below are formed on the copper film 26 and silicon dioxide film 24.

That is to say, a silicon nitride film 30 with a thickness of 50 nm is formed on the copper film 26 and silicon dioxide film 24 by the plasma CVD method. A silicon dioxide film 31 with a thickness of 600 nm is formed on the silicon nitride film 30 by the plasma CVD method. Moreover, an organic insulating film 32 with a thickness of 400 nm is formed on the silicon dioxide film 31 by the spin coat method. In this case, one of the above materials used for forming the organic insulating film 23 should be selected for forming the organic insulating film 32.

Then a silicon dioxide film 33 with a thickness of 100 nm is formed on the organic insulating film 32 by the plasma CVD method. A silicon nitride film 34 with a thickness of 100 nm is formed on the silicon dioxide film 33 by the plasma CVD method.

As shown in FIG. 12(C), after the formation of the above films, the silicon nitride film 34 is coated with a photoresist 35 and exposure and development are performed on the photoresist 35 to form a window. An opening 34a for a wiring having a shape corresponding to a second wiring layer is made in the silicon nitride film 34 by a photolithographic method in which the photoresist 35 is used as a mask (see FIG. 12(D)).

As shown in FIG. 12(D), then the photoresist 35 is ashed by oxygen plasma and is removed. As shown in FIG. 12(E), the surface of the silicon nitride film 34 and the inside of the opening 34a are coated with a photoresist 36 and exposure and development are performed on the photoresist film 36 to form a window, which is in the opening 34a for a wiring and which is opposite to part of the first wiring layer, in the photoresist film 36. This window has a shape corresponding to a contact via. As shown in FIG. 12(F), then the silicon dioxide film 33 is etched through the window in the photoresist film 36 to make an opening 33a having a shape corresponding to the contact via.

As shown in FIG. 12(G), anisotropic plasma etching with oxygen and argon is performed on the organic insulating film 32 through the opening 33a after the above etching to form an opening 32a there. By performing this etching, the photoresist film 36 is also etched and removed. Therefore, a process for removing only the photoresist film 36 is unnecessary and the organic insulating film 32 will not be etched unnecessarily.

Subsequently, as shown in FIG. 12(H), the silicon dioxide film 33 is etched into the shape of a wiring through the opening 34a by plasma etching using gas which contains fluorine with the silicon nitride film 34 as a mask to make an opening 33b. During this etching the organic insulating film 32 is used as a mask and the silicon dioxide film 31 beneath it is also etched through the opening 32a in the organic insulating film 32. As a result, an opening 31a is made in the silicon dioxide film 31 simultaneously with the opening 33b.

Then the organic insulating film 32 is etched into the shape of the wiring through the opening 34a in the silicon nitride film 34 by oxygen plasma. As a result, an opening 32b for a wiring shown in FIG. 12(I) is made there. The opening 32b for a wiring in the organic insulating film 32, together with the opening 33b for a wiring in the silicon dioxide film 33, will be used as a wiring trench in the second wiring layer.

Subsequently, as shown in FIG. 12(J), plasma etching is performed on the silicon nitride film 30 beneath the opening 31a by the use of $C_4F_8$ gas and $O_2$ gas with the silicon dioxide film 31 as a mask to make an opening 30a there. The opening 30a in the silicon nitride film 30 and the opening 31a in the silicon dioxide film 31 are used as a contact via hole and part of wirings on the first wiring layer will get exposed in the bottom of the contact via hole.

As shown in FIG. 12(K), then a barrier metal film 37 of TiN or TaN with a thickness of 50 nm is formed by sputtering on the inner wall of a concave portion formed in the above way. Subsequently, as shown in FIG. 12(L), the lower half of a copper film 38 with a thickness of 100 nm is formed by sputtering and the upper half of the copper film 38 with a thickness of 1,500 nm is formed on it by an electroplating method. Then anneal treatment is performed on the copper film 38 at 400° C. in an atmosphere of hydrogen for thirty minutes in order to improve the reliability of wirings by growing particles in the copper film 38.

Subsequently, as shown in FIG. 12(M), the copper film 38 is polished by the CMP method to leave the copper film 38 only in the wiring trench in the second wiring layer and the contact via hole. A copper film (the upper half of the copper film 38) in the wiring trench in the second wiring layer is used as a wiring and a copper film (the lower half of the copper film 38) left in the contact via hole is used as a plug.

SUMMARY OF THE INVENTION

A method for fabricating a semiconductor device provided by the present invention comprises: a process for forming a cap film, a first insulating film, an organic insulating film, a second insulating film and a mask film in order on a semiconductor substrate; a process for making a first opening of a wiring shaped pattern by etching part of the mask film; a process for making a second opening of a hole shaped pattern by etching part of the second insulating film which overlaps with the first opening; a process for making a third opening of the hole shaped pattern in the organic insulating film by etching the organic insulating film through the second opening in the second insulating film; a process for making a fourth opening of the wiring shaped pattern in the second insulating film by etching the second insulating film through the first opening in the mask film, and for making a fifth opening of the hole shaped pattern in the first insulating film by etching the first insulating film through the third opening in the organic insulating film; a process for making a sixth opening of the hole shaped pattern in the cap film by etching the cap film through the fifth opening in the first insulating film to use the sixth opening and the fifth opening as a via hole, and for removing the mask film; a process for making a seventh opening of the wiring shaped pattern in the organic insulating film by etching the organic insulating film through the fourth opening in the second insulating film to use the seventh opening and the fourth opening as a wiring trench; and a process for forming a via in the via hole and a wiring in the wiring trench by embedding a conductor in the via hole and the wiring trench at the same time.

Furthermore, a method for fabricating a semiconductor device provided by the present invention comprises: a process for forming a cap film, an organic insulating film, an insulating film and a mask film in order on a semiconductor substrate; a process for making a first opening of a wiring shaped pattern by etching part of the mask film; a process for making a second opening of a hole shaped pattern by etching part of the insulating film which overlaps with the first opening; a process for making a third opening of the hole shaped pattern in the organic insulating film by etching the organic insulating film through the second opening in the insulating film; a process for making a fourth opening of the wiring shaped pattern in the insulating film by etching the insulating film through the first opening in the mask film; a process for making a fifth opening of the hole shaped pattern in the cap film by etching the cap film through the third opening in the organic insulating film to use the fifth opening and the third opening as a via hole, and for removing the mask film; a process for making a sixth opening of the wiring shaped pattern in the organic insulating film by etching the organic insulating film through the fourth opening in the insulating film to use the sixth opening and the fourth opening as a wiring trench; and a process for forming a via in the via hole and a wiring in the wiring trench by embedding a conductor in the via hole and the wiring trench at the same time.

In addition, a method for fabricating a semiconductor device provided by the present invention comprises: a process for forming a cap film, a first organic insulating film, a first insulating film, a second organic insulating film, a second insulating film and a mask film in order on a semiconductor substrate; a process for making a first opening of a wiring shaped pattern by etching part of the mask film; a process for making a second opening of a hole shaped pattern by etching part of the second insulating film which overlaps with the first opening; a process for making a third opening of the hole shaped pattern in the second organic insulating film by etching the second organic insulating film through the second opening in the second insulating film; a process for making a fourth opening of the hole shaped pattern in the first insulating film by etching the first insulating film through the third opening in the second organic insulating film; a process for making a fifth opening of the hole shaped pattern in the first organic insulating film by etching the first organic insulating film through the fourth opening in the first insulating film; a process for making a sixth opening of the wiring shaped pattern in the second insulating film by etching the second insulating film through the first opening in the mask film; a process for making a seventh opening of the hole shaped pattern in the cap film by etching the cap film through the fifth opening in the first organic insulating film to use the seventh opening, the fourth opening, and the fifth opening as a via hole, and for removing the mask film; a process for making an eighth opening of the wiring shaped pattern in the second organic insulating film by etching the second organic insulating film through the sixth opening in the second insulating film to use the eighth opening and the sixth opening as a wiring trench; and a process for forming a via in the via hole and a wiring in the wiring trench by embedding a conductor in the via hole and the wiring trench at the same time.

The above and other features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 1(A), 1(B), and 1(C) are views for giving an overview of a method for fabricating a semiconductor device in which a conventional dual damascene method is used.

FIGS. 2(A), 2(B), and 2(C) are views for giving an overview of a method for fabricating a semiconductor device, according to the present invention.

FIGS. 12(A) through 12(M) are views for describing a method for fabricating a semiconductor device in which the conventional dual damascene method is used.

DESCRIPTION OF THE PREFERRED EMBODIMENTS

Figure 12C:
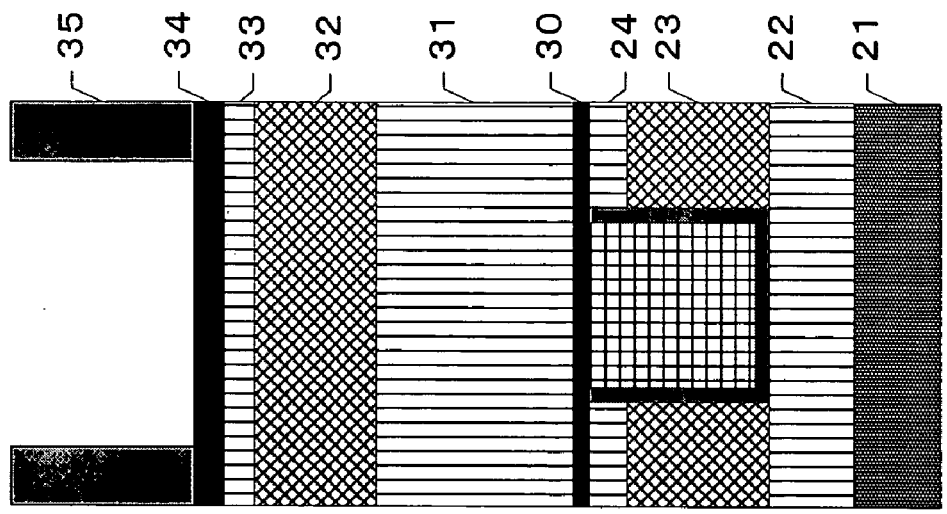
Figure 12B:
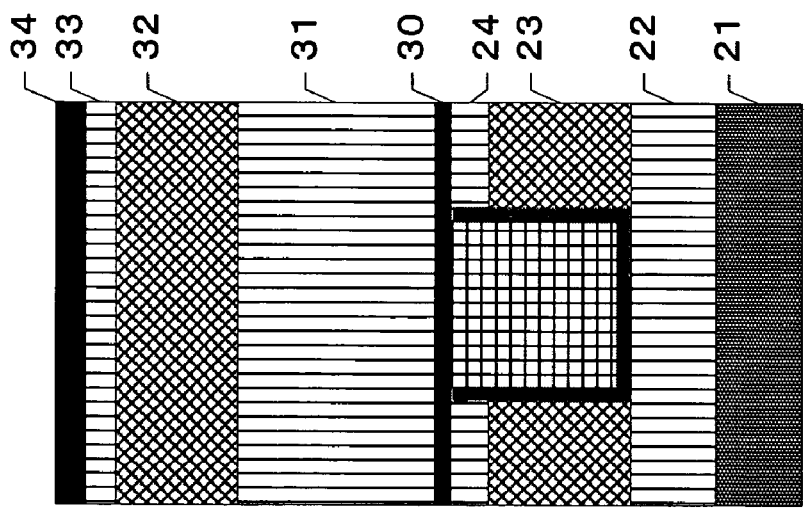
Figure 12A:
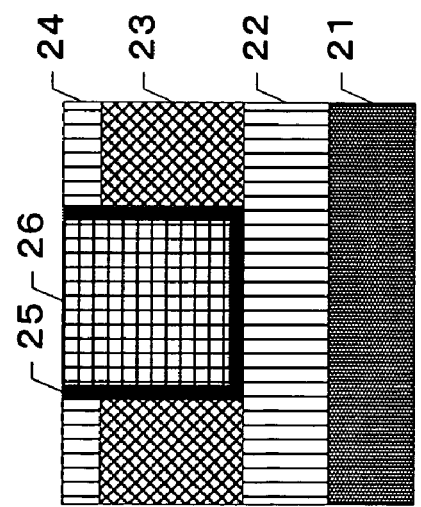
Figure 12I:
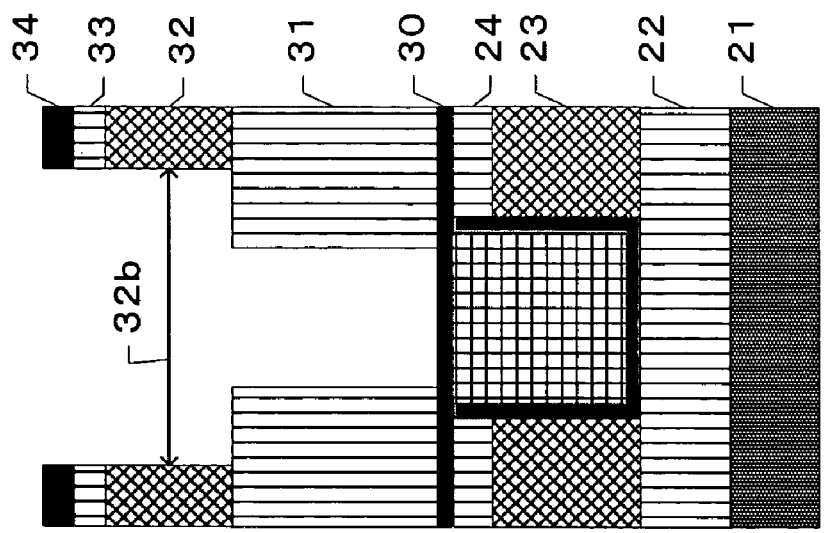
Figure 12H:
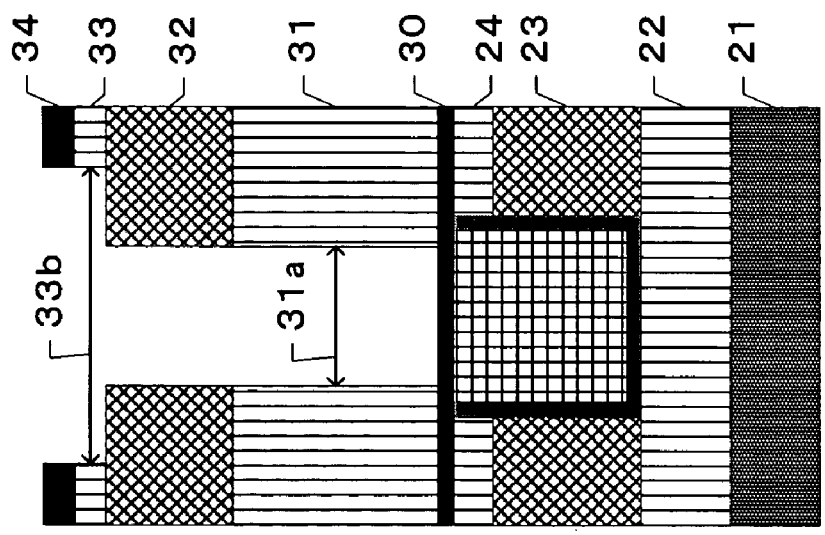
Figure 12G:
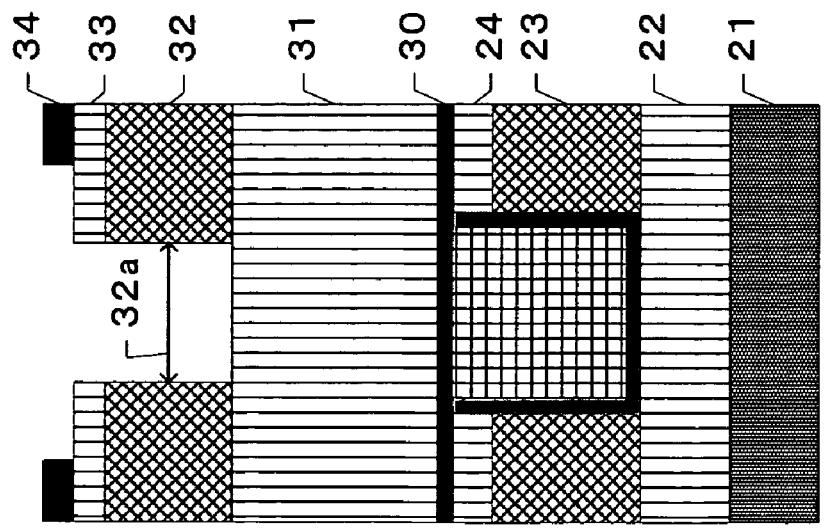
Figure 12L:
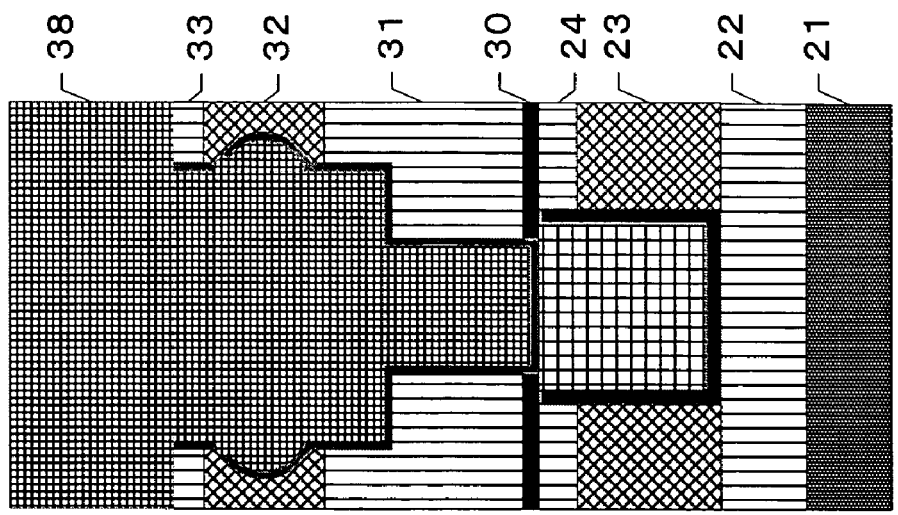
Figure 12K:
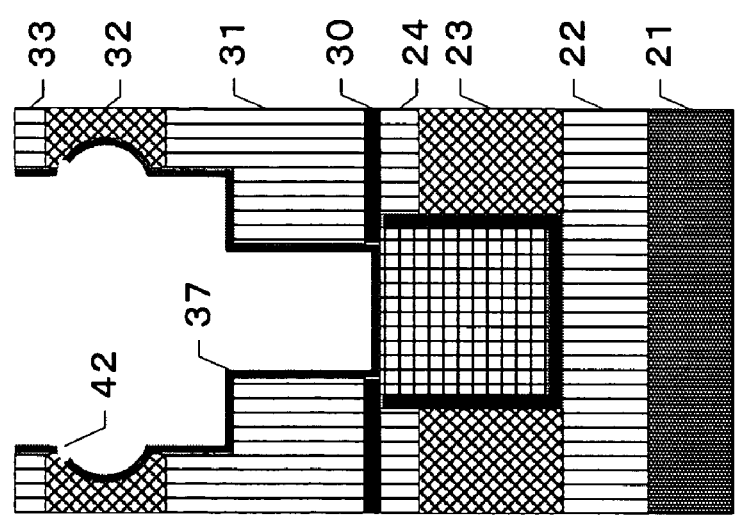
Figure 12J:
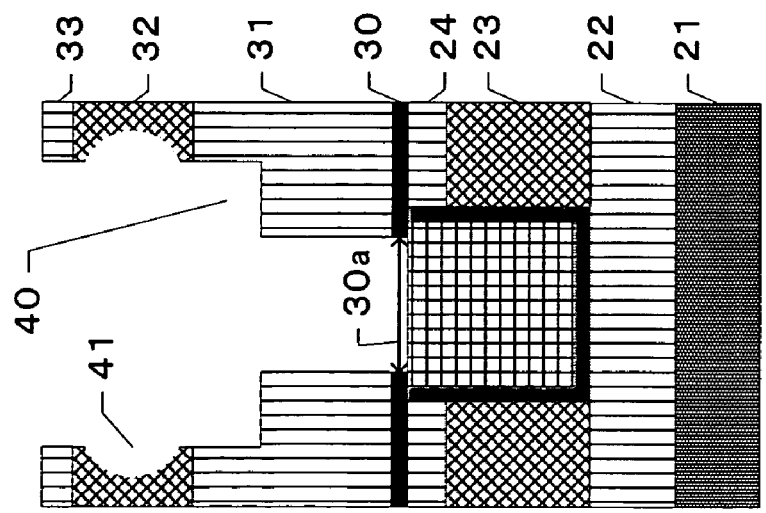
Figure 12M:
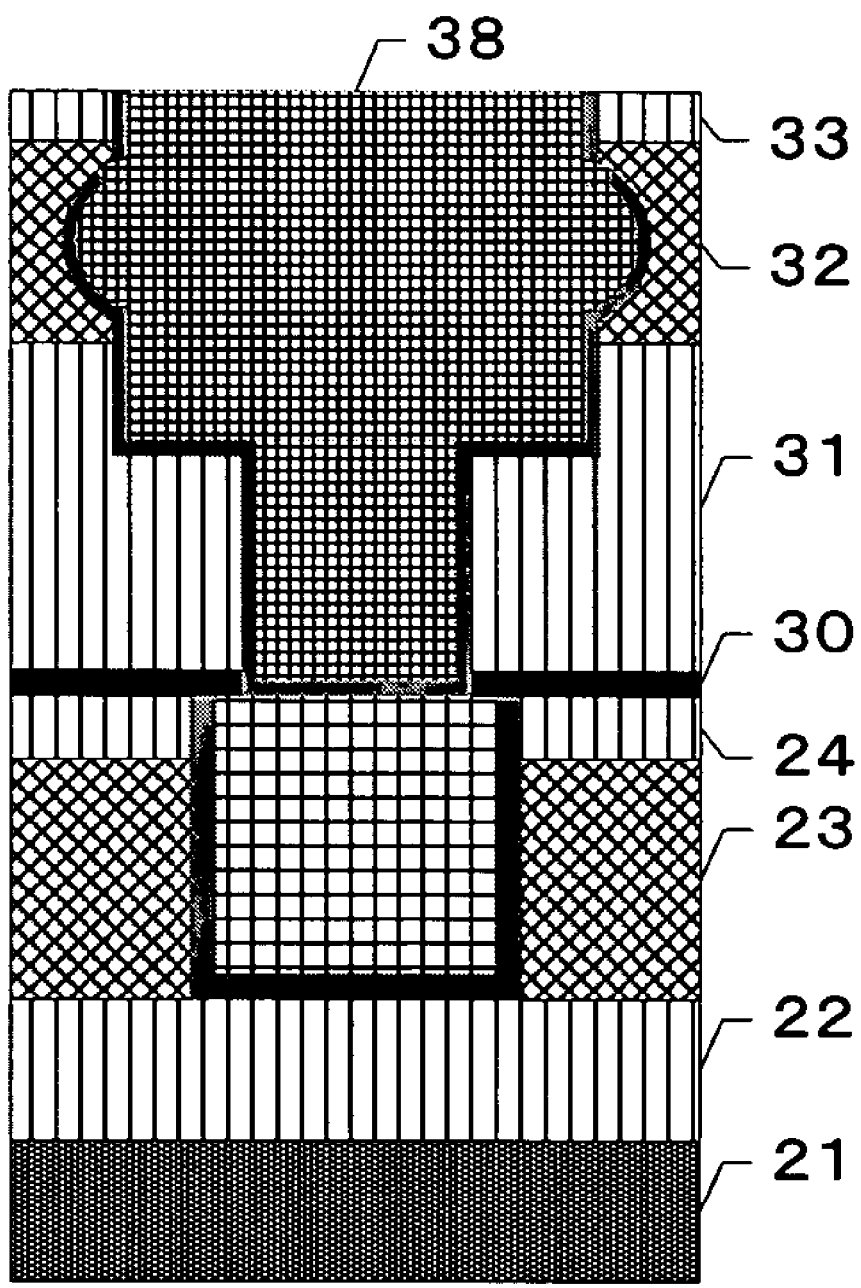

In the process shown in FIG. 12(J) and described in "Description of the Related Art," plasma etching is performed on the silicon nitride film 30 beneath the opening 31a by the use of $C_4F_8$ gas and $O_2$ gas with the silicon dioxide film 31 as a mask. At this time the silicon dioxide film 31 is also eaten away and a thickness reduction 40 shown in FIG. 12(J) occurs. In addition, the organic insulating film 32 is eaten away and bowing 41 arises.

Figure 13:
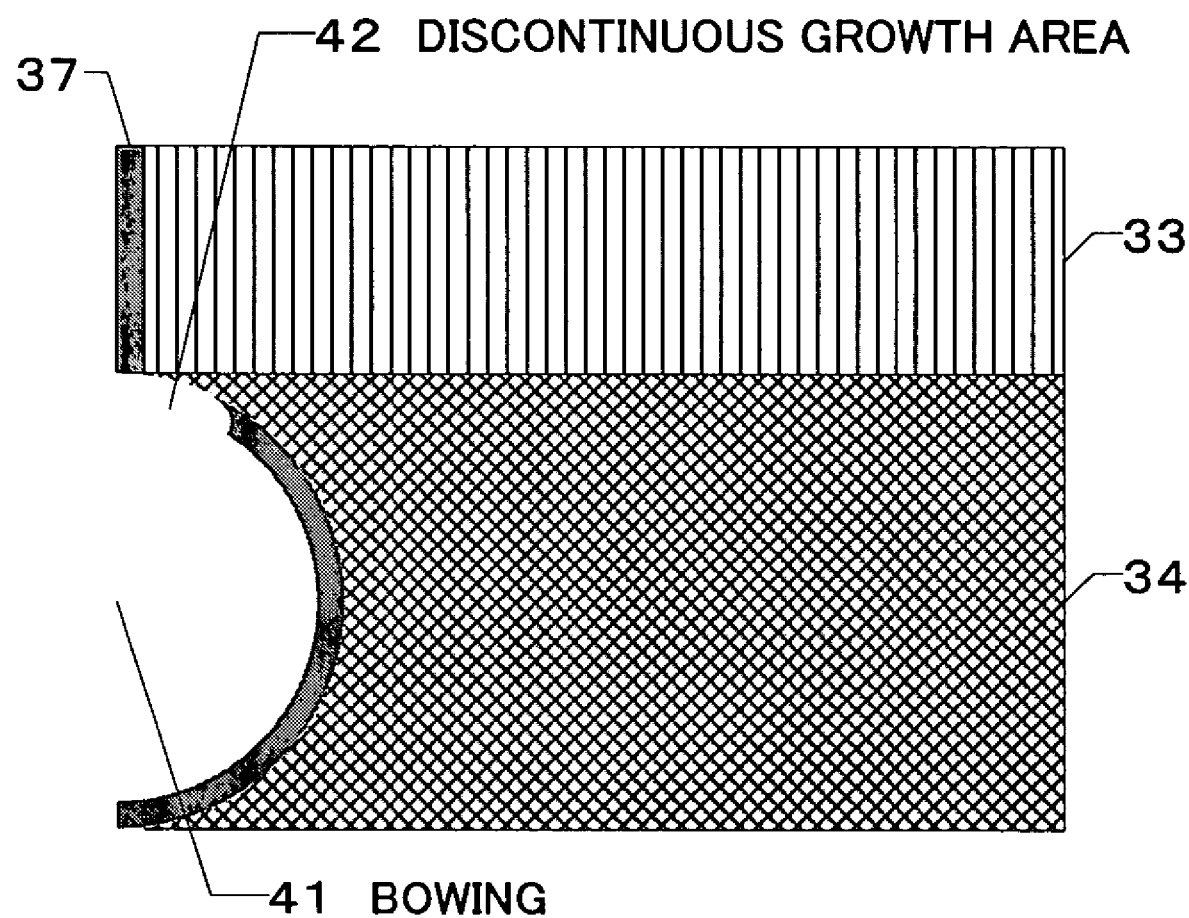
FIG. 13 is a view for describing the discontinuous growth area in detail.

FIG. 13 is an enlarged view of a section of an area where the bowing 41 has arisen. Therefore, the sputtering in FIG. 12(K) will be performed in a state in which the bowing 41 shown in FIG. 13 has arisen. As a result, when the barrier metal film 37 of TiN or TaN is formed, it will not be formed adequately in the shadow and there will appear a discontinuous growth area 42. This leads to the diffusion of copper from the copper film 38 and degradation in quality.

Furthermore, if the thickness reduction 40 and the bowing 41 have occurred, the cross-sectional area of a wiring will be larger than usual. This leads to an increase in capacitance between wirings and a reduction in operating speed.

In addition, when the plasma etching is performed by the use of $C_4F_8$ gas and $O_2$ gas, a deposit which contains $CF_x$ is formed and adheres to the copper film 26. Moreover, the copper film 26 itself is oxidized to a copper oxide. This results in a low yield rate.

The present invention was made to solve the above problems. An object of the present invention is to provide a method for fabricating a semiconductor device using the dual damascene method in which yield rates for semiconductor devices can be improved by preventing the occurrence of the thickness reduction 40 and the bowing 41.

Embodiments of the present invention will now be described with reference to the drawings.

FIGS. 1 and 2 are views for describing the principles underlying the present invention. A conventional method for fabricating a semiconductor device will briefly be described first with reference to FIG. 1, then the principles underlying the present invention will be described with reference to FIG. 2.

The conventional method for fabricating a semiconductor device is as follows. As shown in FIG. 1(A), silicon dioxide films 31 and 33 are etched. As shown in FIG. 1(B), then an organic insulating film 32 is etched. Finally, as shown in FIG. 1(C), silicon nitride films 30 and 34 are etched. Therefore, in the last process shown in FIG. 1(C), a thickness reduction 40 and bowing 41 occur, a deposit 44 which contains $CF_x$ is formed, and a copper oxide 43 is formed on a copper film 26.

In the present invention, the order in which the processes shown in FIGS. 1(B) and 1(C) are performed is changed. That is to say, as shown in FIG. 2(B), a process for etching silicon nitride films is performed first. At this time a silicon dioxide film 31 is masked by an organic insulating film 32, so the occurrence of a thickness reduction is prevented.

Plasma etching can be performed on the organic insulating film 32 by the use of oxygen gas or hydrogen gas. By using such gas, high etching selectivity can be ensured in relation to the silicon dioxide film 31. As a result, the occurrence of a thickness reduction can be prevented.

In the process shown in FIG. 2(B), a deposit 44 which contains $CF_x$ will be formed and a copper oxide 43 will be formed on a copper film 26. This is the same with the conventional method. By performing plasma etching by the use of oxygen gas or hydrogen gas in a process shown in FIG. 2(C), however, the deposit 44 which contains $CF_x$ can be converted into a volatile gas and be removed. In addition, by performing etching by the use of hydrogen gas, the copper oxide 43 can be deoxidized to copper. In this case, ammonia ($NH_3$) gas or the like may be used in place of hydrogen gas.

This prevents an increase in capacitance between wirings and raises a yield rate.

A first embodiment of the present invention will now be described with reference to FIG. 3. Processes which are the same as those shown in FIGS. 12(A) through 12(G) are performed in the first embodiment of the present invention, so descriptions of them will be omitted.

Figure 3C:
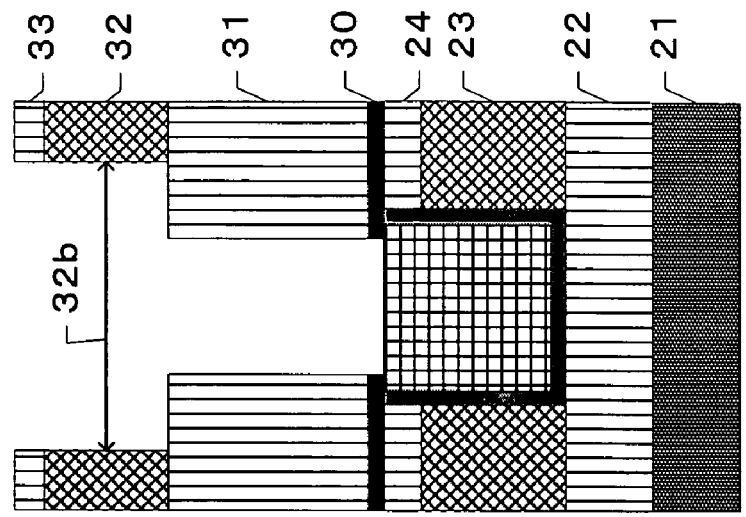
FIGS. 3(A) through 3(F) are views for describing a method for fabricating a semiconductor device, according to a first embodiment of the present invention.
Figure 3B:
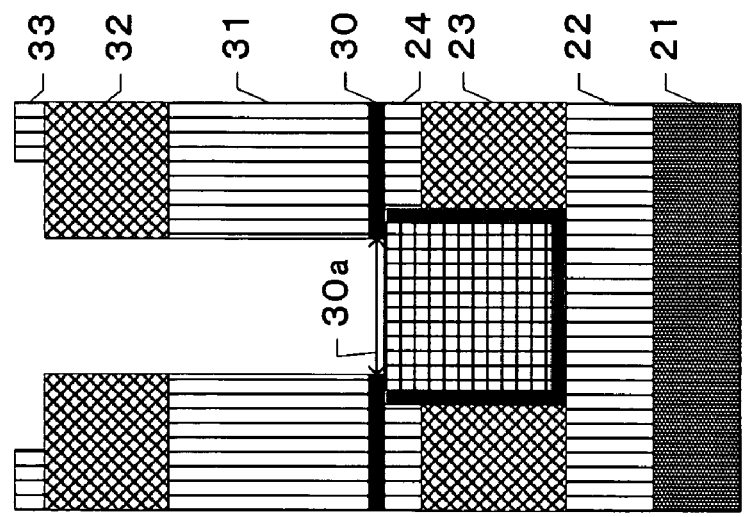
Figure 3A:
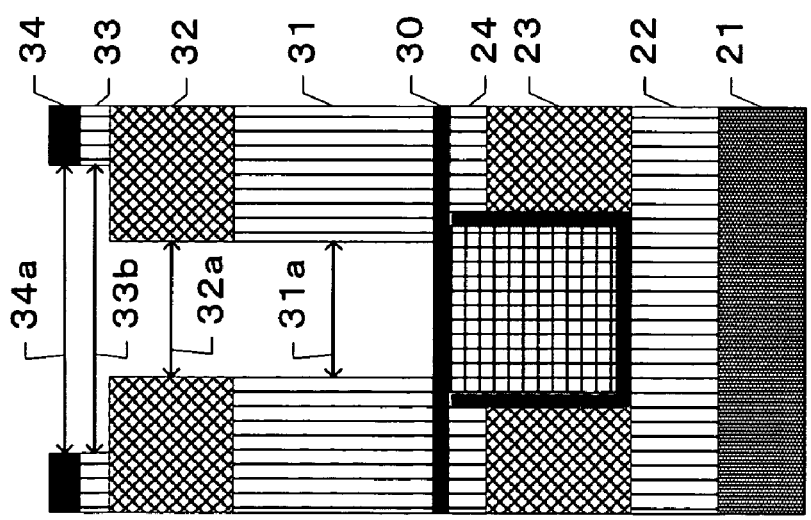

As shown in FIG. 3(A), after the organic insulating film 32 is etched, a silicon dioxide film 33 is etched through an opening 34a into the shape of a wiring by plasma etching using gas which contains fluorine with a silicon nitride film 34 as a mask to make an opening 33b. During this etching the organic insulating film 32 is used as a mask and the silicon dioxide film 31 beneath it is also etched through an opening 32a in the organic insulating film 32. As a result, an opening 31a is made in the silicon dioxide film 31 simultaneously with the opening 33b.

Subsequently, as shown in FIG. 3(B), plasma etching is performed on a silicon nitride film 30 beneath the opening 31a by the use of $C_4F_8$ gas and $O_2$ gas with the silicon dioxide film 31 as a mask to make an opening 30a there. The opening 30a in the silicon nitride film 30 and the opening 31a in the silicon dioxide film 31 are used as a contact via hole and part of wirings on a first wiring layer will get exposed in the bottom of the contact via hole.

At this time the silicon dioxide film 31 is protected by the organic insulating film 32, so the occurrence of a thickness reduction is prevented.

Then the organic insulating film 32 is etched by hydrogen or oxygen plasma through the opening 33b in the silicon dioxide film 33. As a result, an opening 32b for a wiring shown in FIG. 3(C) is made there. The opening 32b for a wiring in the organic insulating film 32, together with the opening 33b for a wiring in the silicon dioxide film 33, will be used as a wiring trench in a second wiring layer. At this time bowing does not occur in the organic insulating film 32.

By performing plasma etching by the use of hydrogen gas or oxygen gas, high etching selectivity can be obtained in relation to the silicon dioxide film 31. As a result, the occurrence of a thickness reduction can be prevented. In the process shown in FIG. 3(B), a deposit which contains $CF_x$ will be formed and a copper oxide will be formed on a copper film 26. By performing plasma etching by the use of hydrogen gas or oxygen gas in the process shown in FIG. 3(C), however, the deposit which contains $CF_x$ can be converted into a volatile gas and be removed. In addition, by performing etching by the use of hydrogen gas, the copper oxide can be deoxidized to copper.

Figure 3F:
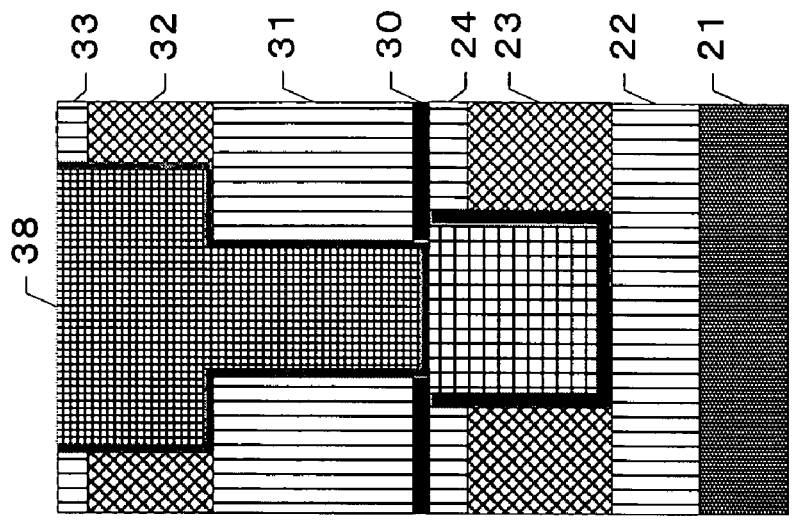
Figure 3E:
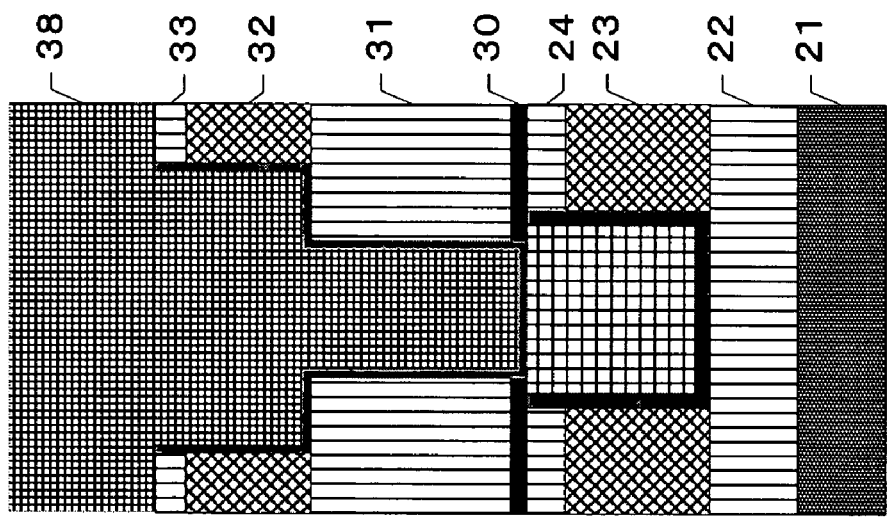
Figure 3D:
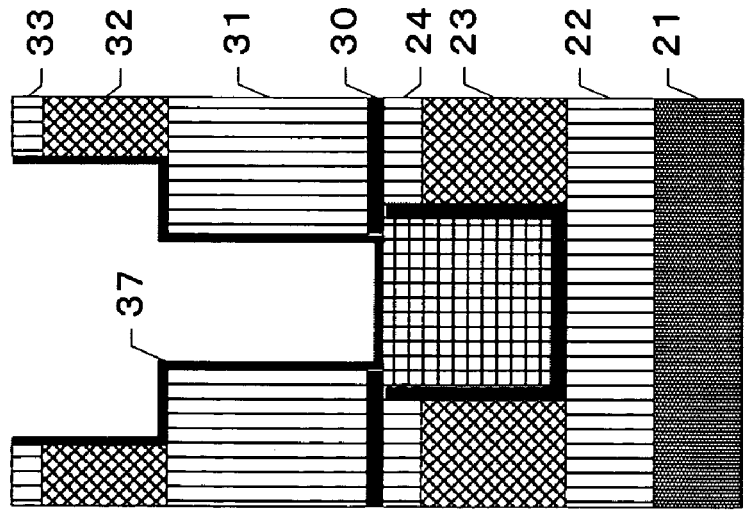

As shown in FIG. 3(D), then a barrier metal film 37 of TiN or TaN with a thickness of 50 nm is formed by sputtering on the inner wall of a concave portion formed by the above processes.

Subsequently, as shown in FIG. 3(E), the lower half of a copper film 38 with a thickness of 100 nm is formed by sputtering and the upper half of the copper film 38 with a thickness of 1500 nm is formed on it by an electroplating method. Then anneal treatment is performed on the copper film 38 at 400° C. in an atmosphere of hydrogen for thirty minutes in order to improve the reliability of wirings by growing particles in the copper film 38.

Subsequently, as shown in FIG. 3(F), the copper film 38 is polished by a CMP method to leave the copper film 38 only in the wiring trench in the second wiring layer and the contact via hole. A copper film (the upper half of the copper film 38) in the wiring trench in the second wiring layer is used as a wiring and a copper film (the lower half of the copper film 38) left in the contact via hole is used as a plug.

According to the above-mentioned first embodiment of the present invention, the occurrence of a thickness reduction and bowing can be controlled compared with the conventional method. This prevents an increase in capacitance between wirings.

Furthermore, a deposit which contains $CF_x$ can be removed and a copper oxide can be deoxidized to copper. As a result, a yield rate can be raised.

In addition, the appearance of a discontinuous barrier metal growth area can be prevented. This prevents a short of a wiring caused by the diffusion of copper.

The organic insulating film 32 in the first embodiment of the present invention shown in FIG. 3 may be formed by the use of a polymer which contains arylether, organic SOG, inorganic SOG, or silicon oxycarbide (SiOC). The same applies to organic insulating films in the other embodiments described later.

Figure 4:
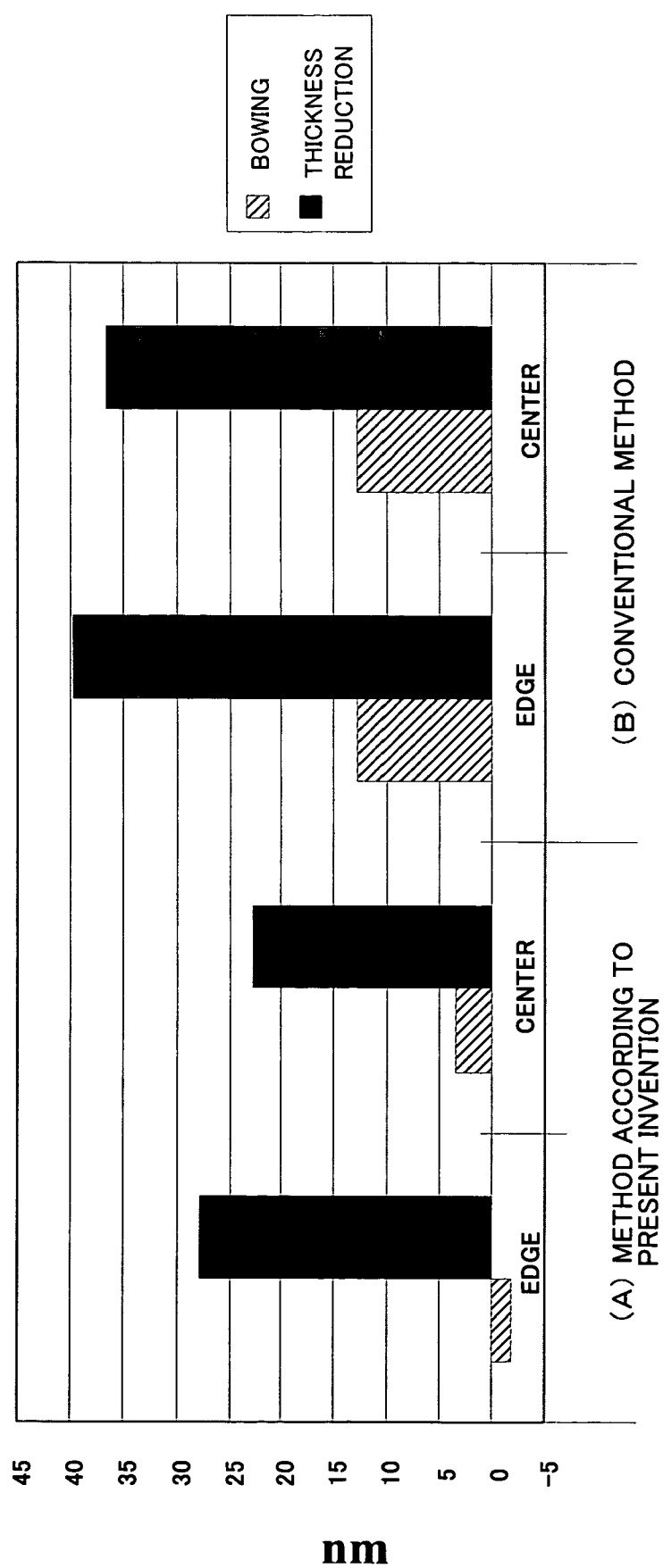
FIG. 4 shows the differences in the amounts of thickness reduction and bowing between the conventional method and the method according to the present invention.
Figure 5:
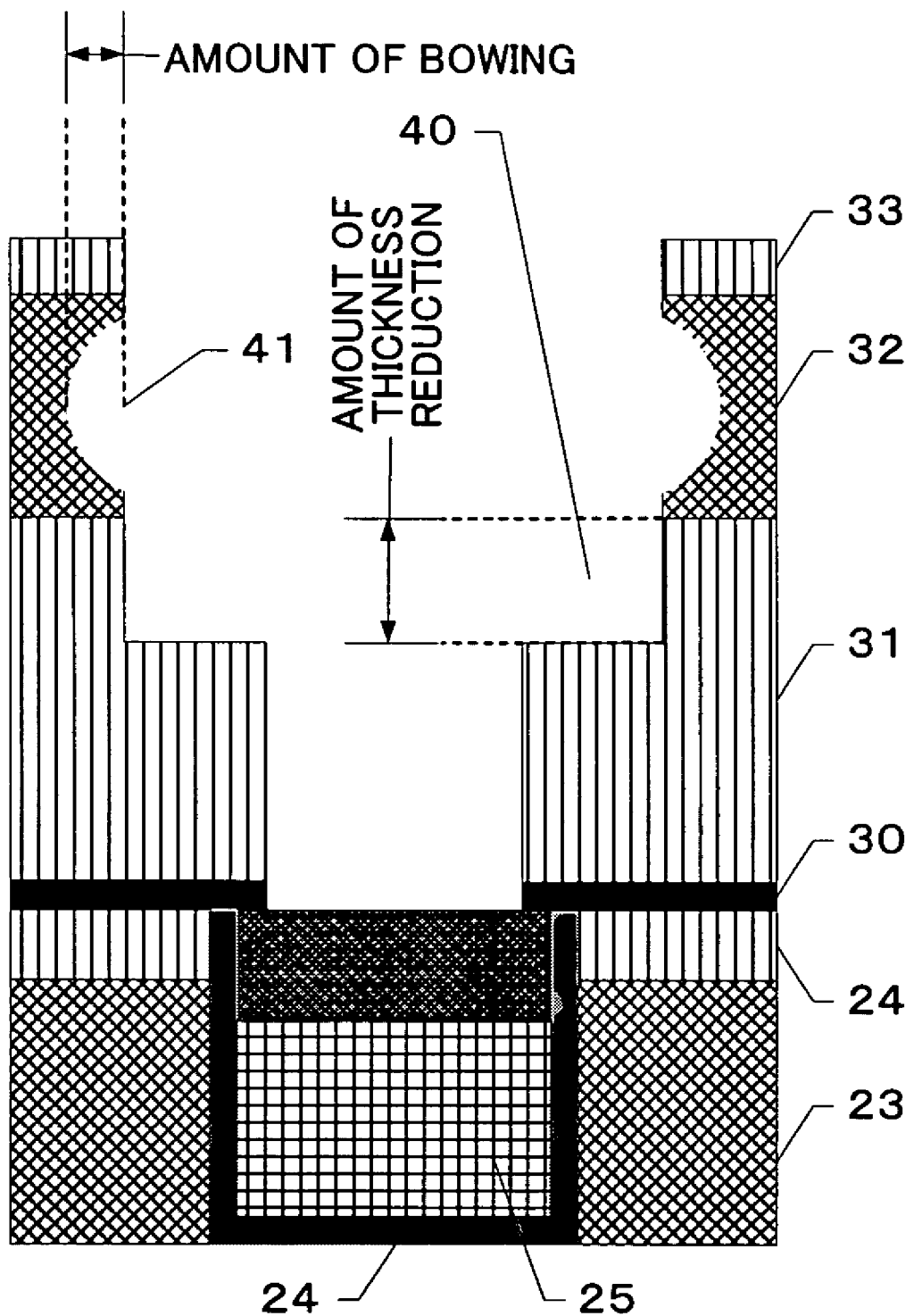
FIG. 5 shows the definitions of a reduction in thickness and the amount of bowing.

FIG. 4 shows the differences in the amounts of thickness reduction and bowing between the conventional method and the method according to the present invention. The definitions of the amounts of a thickness reduction and bowing are shown in FIG. 5. That is to say, the amount of a thickness reduction is distance from the top of the silicon dioxide film 31 and the amount of bowing is the distance from the inner wall surface of the silicon dioxide film 33 to the deepest part of the bowing.

In FIG. 4, "Edge" means the edge of a wafer and "Center" indicates the center of the wafer.

As can be seen from FIG. 4, the amounts of a thickness reduction and bowing in the method according to the present invention are smaller than the amounts of a thickness reduction and bowing, respectively, in the conventional method. For example, the amounts of a thickness reduction and bowing at "Center" are about 36 and 12.5 nm, respectively, in the conventional method, while the amounts of a thickness reduction and bowing and bowing at "Center" are about 22.5 and 3 nm, respectively, in the method according to the present invention.

Furthermore, as shown in FIG. 13, with the conventional method the discontinuous growth area 42 appears in the barrier metal film 37. As a result, copper diffuses from the copper film 38 and a short of a wiring may occur. In the present invention, however, the occurrence of bowing which may cause the discontinuous growth area 42 to appear can be controlled, so a short of a wiring by such a cause can be prevented.

Figure 6:
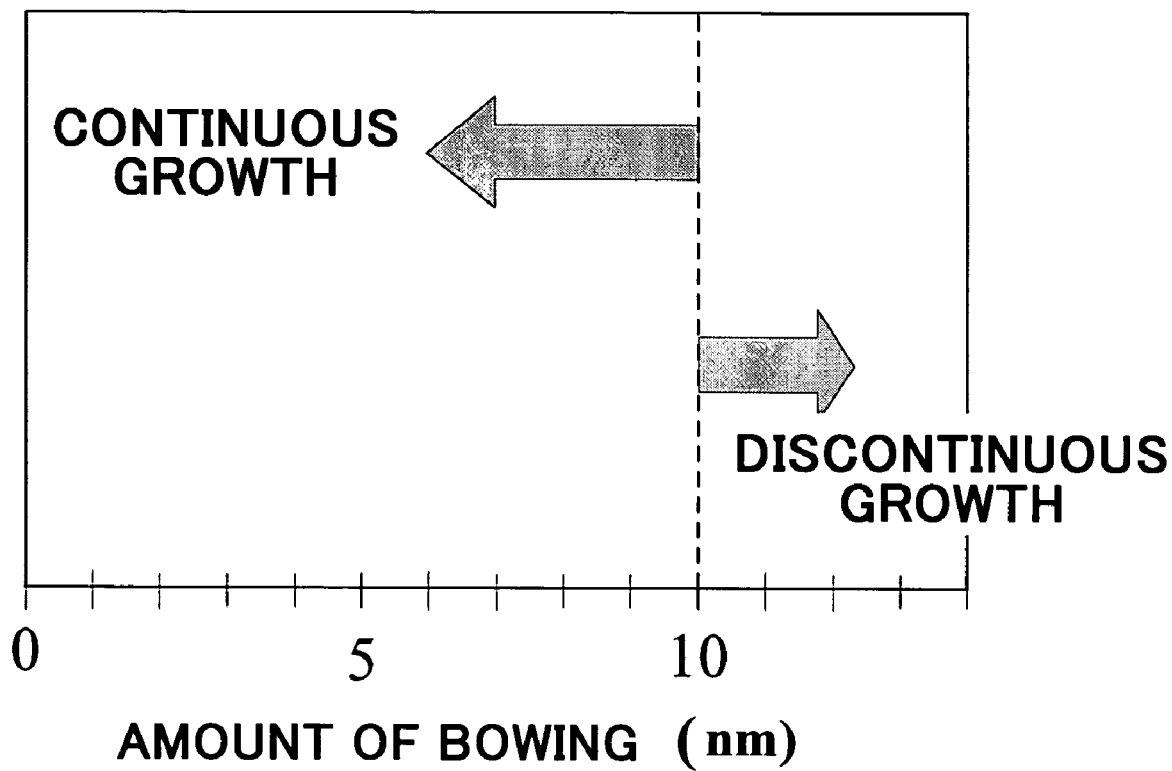
FIG. 6 shows the relation between the amount of bowing and the appearance of a discontinuous growth area.

Experiments by the present inventor revealed that when the amount of bowing exceeds 10 nm, the probability of a discontinuous growth area appearing increases. This is shown in FIG. 6. Therefore, various parameters and the like should be set so that the amount of bowing will be smaller than or equal to 10 nm.

Figure 7:
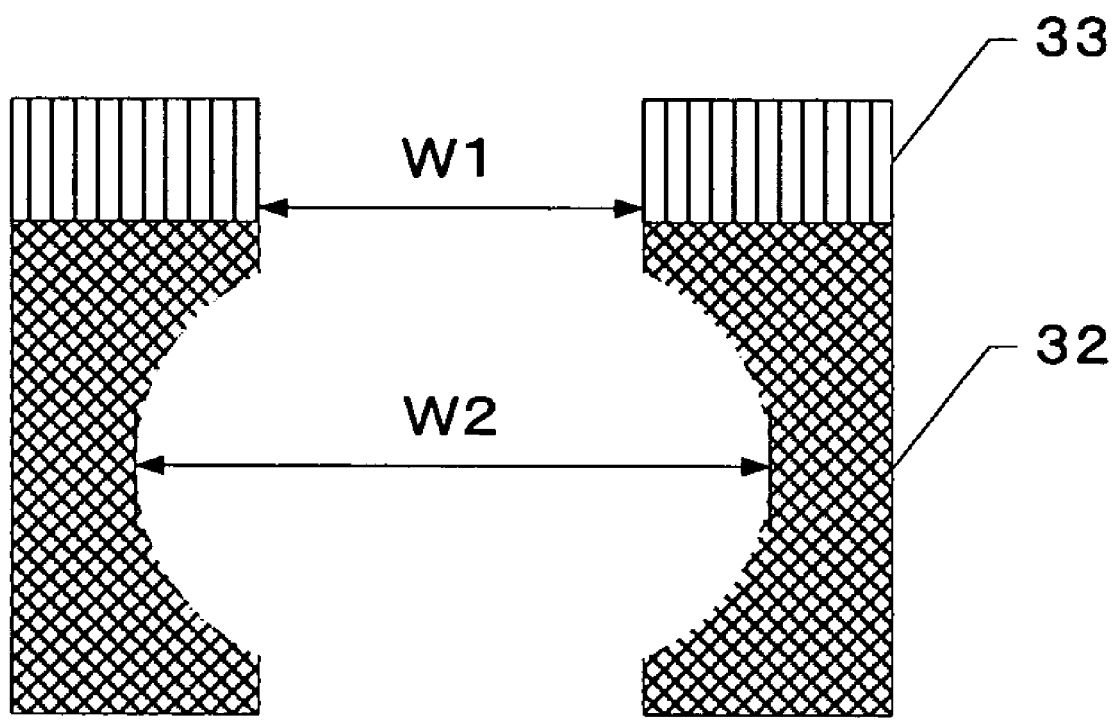
FIG. 7 shows the definitions of W1 and W2.

The appearance of a discontinuous growth area can be prevented by setting various parameters, such as etching time, so that the following inequality will hold.

$$(W2-W1)/2 \leq 10 \text{ nm}$$

where, as shown in FIG. 7, W1 is the distance between the inner wall surfaces of the silicon dioxide film 33 and W2 is the width of the deepest part of bowing which occurs in the organic insulating film 32.

A method for fabricating a semiconductor device according to a second embodiment of the present invention will now be described with reference to FIGS. 8(A) through 8(J).

Figure 8C:
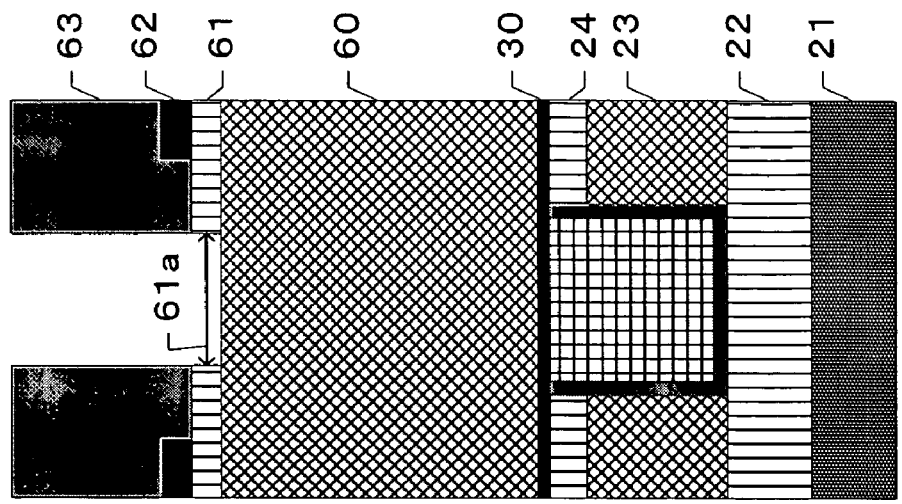
FIGS. 8(A) through 8(J) are views for describing a method for fabricating a semiconductor device, according to a second embodiment of the present invention.
Figure 8B:
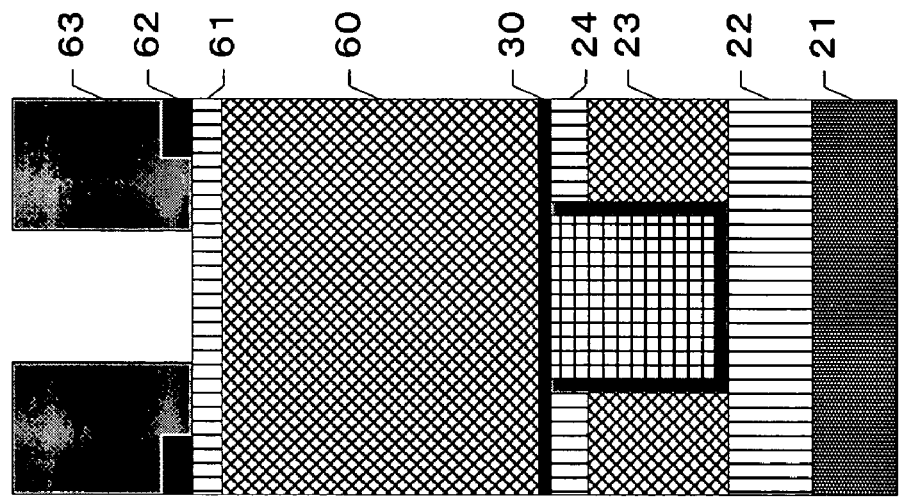
Figure 8A:
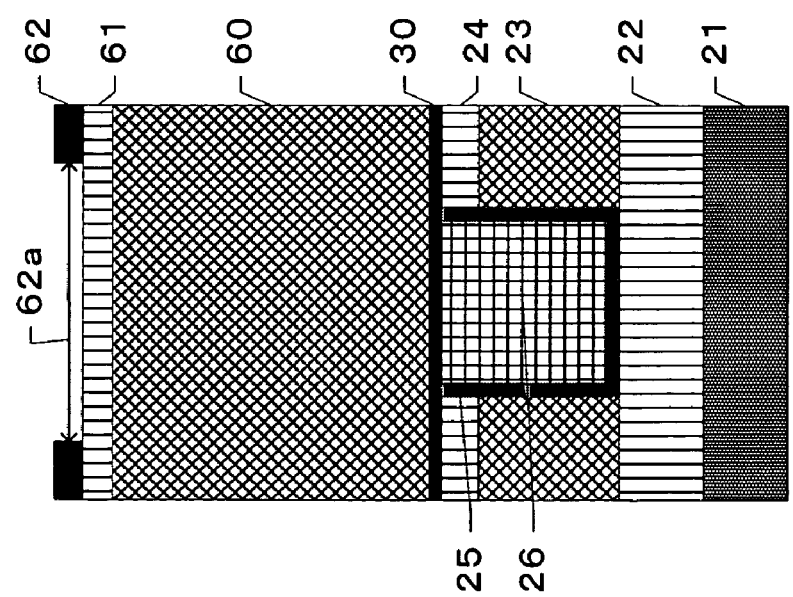

As shown in FIG. 8(A), a silicon substrate 21, a silicon dioxide film 22, an organic insulating film 23, a silicon dioxide film 24, a barrier metal film 25, a copper film 26, and a silicon nitride film 30 in the second embodiment of the present invention are the same as those in the first embodiment of the present invention and are formed by the above processes.

In the second embodiment, then an organic insulating film 60 with a thickness of 1,000 nm is formed on the silicon nitride film 30 by the use of, for example, the above SiLK by a spin coat method.

Then a silicon dioxide film 61 with a thickness of 100 nm is formed on the organic insulating film 60 by a plasma CVD method. Subsequently, a silicon nitride film 62 with a thickness of 100 nm is formed on the silicon dioxide film 61 by the plasma CVD method. After that, an opening 62a for a wiring having a shape corresponding to a second wiring layer is made in the silicon nitride film 62 by a process which is the same as that shown in FIG. 12(C).

As shown in FIG. 8(B), then the surface of the silicon nitride film 62 and the inside of the opening 62a are coated with a photoresist film 63 and exposure and development are performed on the photoresist film 63 to form a window, which is in the opening 62a for a wiring and which is opposite to part of a first wiring layer, in the photoresist film 63. This window has a shape corresponding to a contact via. As shown in FIG. 8(C), then the silicon dioxide film 61 is etched through the window in the photoresist film 63 to make an opening 61a having a shape corresponding to the contact via.

Figure 8F:
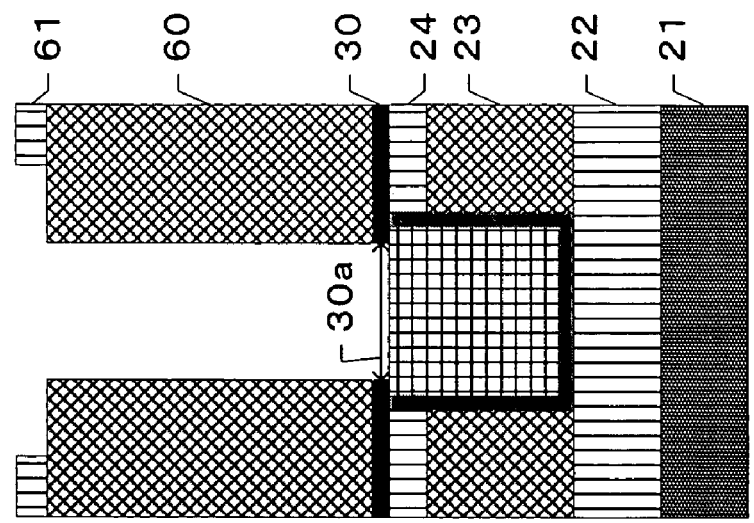
Figure 8E:
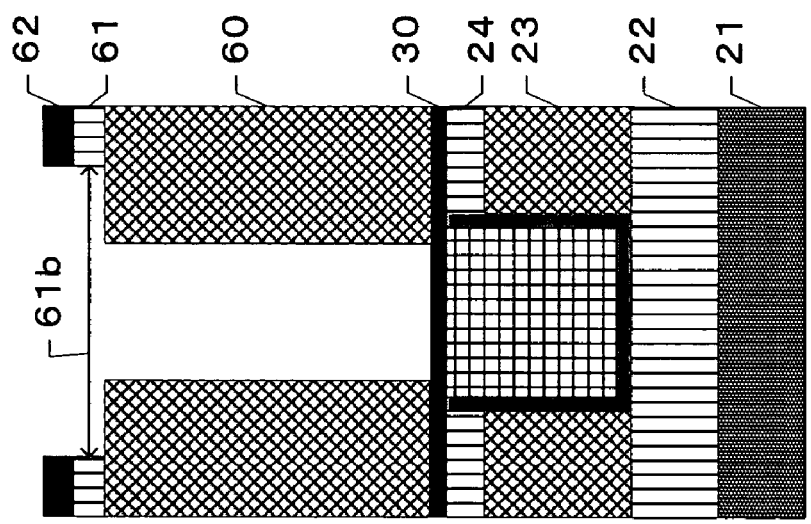
Figure 8D:
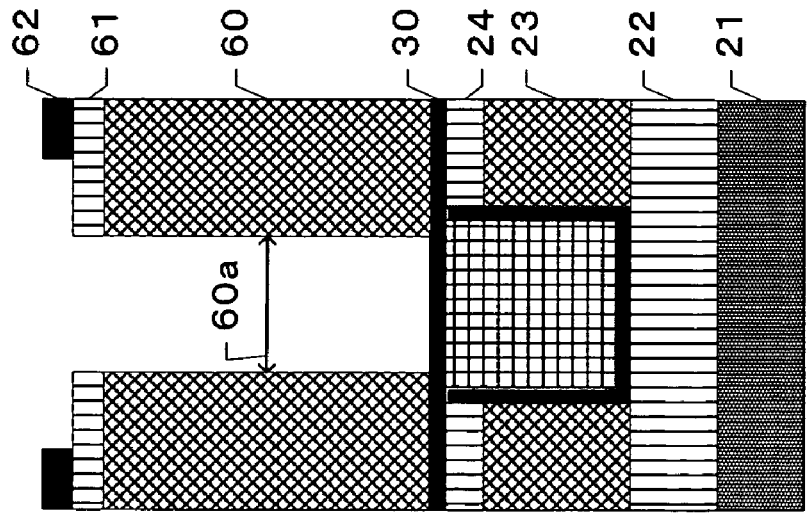

As shown in FIG. 8(D), anisotropic plasma etching with oxygen and argon is performed on the organic insulating film 60 through the opening 61a after the above etching to form an opening 60a there. By performing this etching, the photoresist film 63 is also etched and removed. Therefore, a process for removing only the photoresist film 63 is unnecessary and the organic insulating film 60 will not be etched unnecessarily. This etching can be performed by the use of hydrogen ($H_2$) gas or ammonia ($NH_3$) gas in place of oxygen and argon.

Subsequently, as shown in FIG. 8(E), the silicon dioxide film 61 is etched into the shape of a wiring through the opening 62a by plasma etching using gas which contains fluorine with the silicon nitride film 62 as a mask to make an opening 61b.

As shown in FIG. 8(F), then plasma etching is performed on the silicon nitride film 30 beneath the opening 60a by the use of $C_4F_8$ gas and $O_2$ gas with the organic insulating film 60 as a mask to make an opening 30a there. The opening 30a in the silicon nitride film 30 and the opening 60a in the organic insulating film 60 are used as a contact via hole and part of wirings on the first wiring layer will get exposed in the bottom of the contact via hole. At this time the silicon nitride film 62 is also be removed.

Figure 8I:
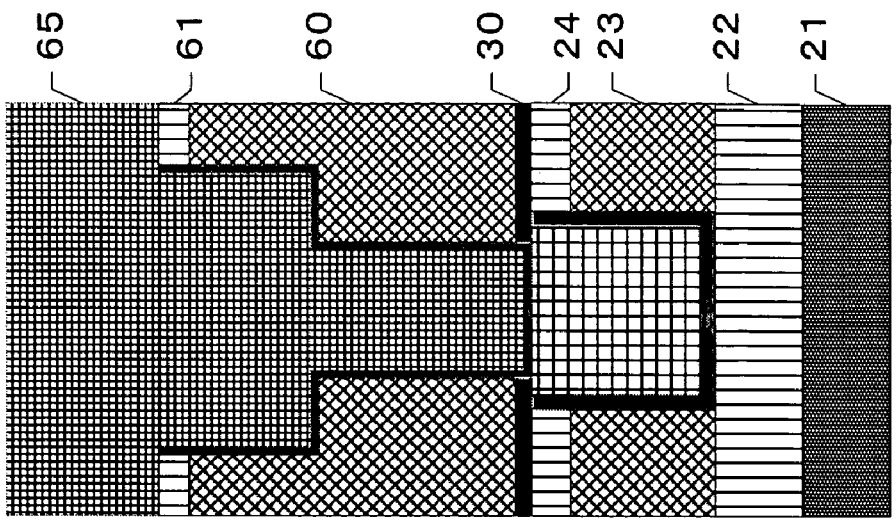

Subsequently the organic insulating film 60 is etched through the opening 61b in the silicon dioxide film 61 by hydrogen or oxygen plasma for a certain period of time. As a result, the organic insulating film 60 forms the shape of the wiring and an opening 60b for a wiring shown in FIG. 8(G) is made there. The opening 60b for a wiring in the organic insulating film 60, together with the opening 61b for a wiring in the silicon dioxide film 61, will be used as a wiring trench in the second wiring layer.

In the second embodiment of the present invention, the organic insulating film 60 is etched after the silicon nitride films 30 and 62 are etched. As a result, the occurrence of a thickness reduction can be prevented and the amount of bowing which occurs in SiLK can be reduced. In the process shown in FIG. 8(F), a deposit which contains $CF_x$ will be formed and a copper oxide will be formed on the copper film 26. By performing plasma etching by the use of oxygen gas or hydrogen gas in the process shown in FIG. 8(G), however, the deposit which contains $CF_x$ can be converted into a volatile gas and be removed. In addition, by performing etching by the use of hydrogen gas, the copper oxide can be deoxidized to copper.

Figure 8H:
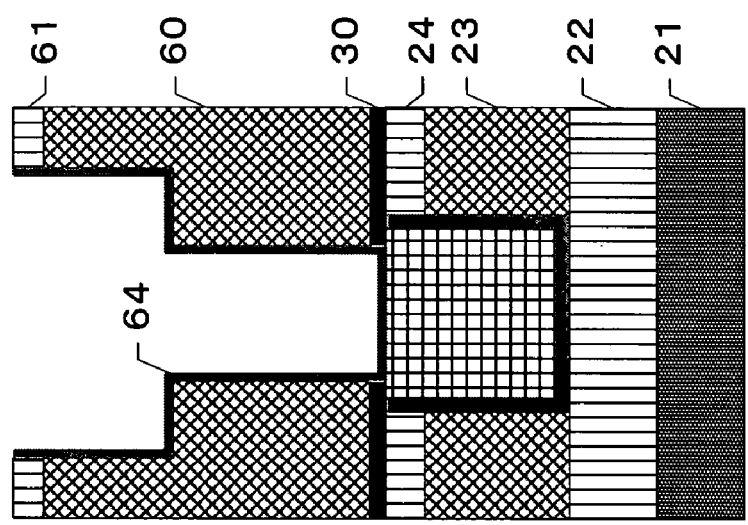
Figure 8G:
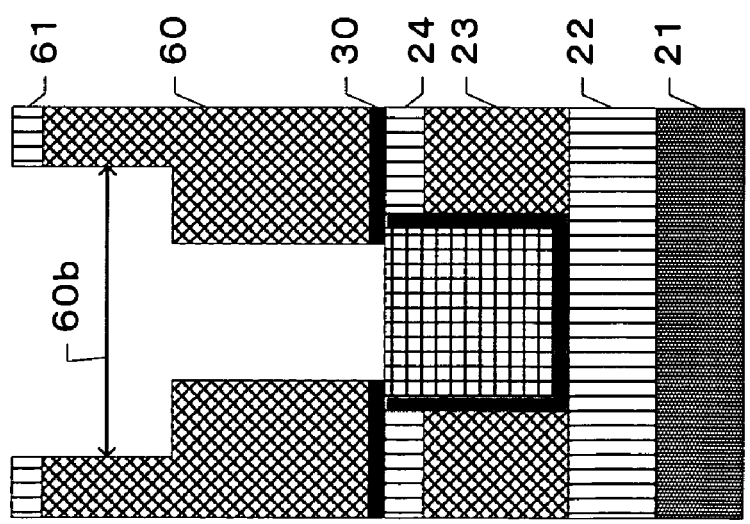

As shown in FIG. 8(H), then a barrier metal film 64 of TiN or TaN with a thickness of 50 nm is formed by sputtering on the inner wall of a concave portion formed in the above way. Subsequently, as shown in FIG. 8(I), the lower half of a copper film 65 with a thickness of 100 nm is formed by sputtering and the upper half of the copper film 65 with a thickness of 1,500 nm is formed on it by an electroplating method. Then anneal treatment is performed on the copper film 65 at 400° C. in an atmosphere of hydrogen for thirty minutes. As stated above, this anneal treatment is performed in order to improve the reliability of wirings by growing particles in the copper film 65.

Figure 8J:
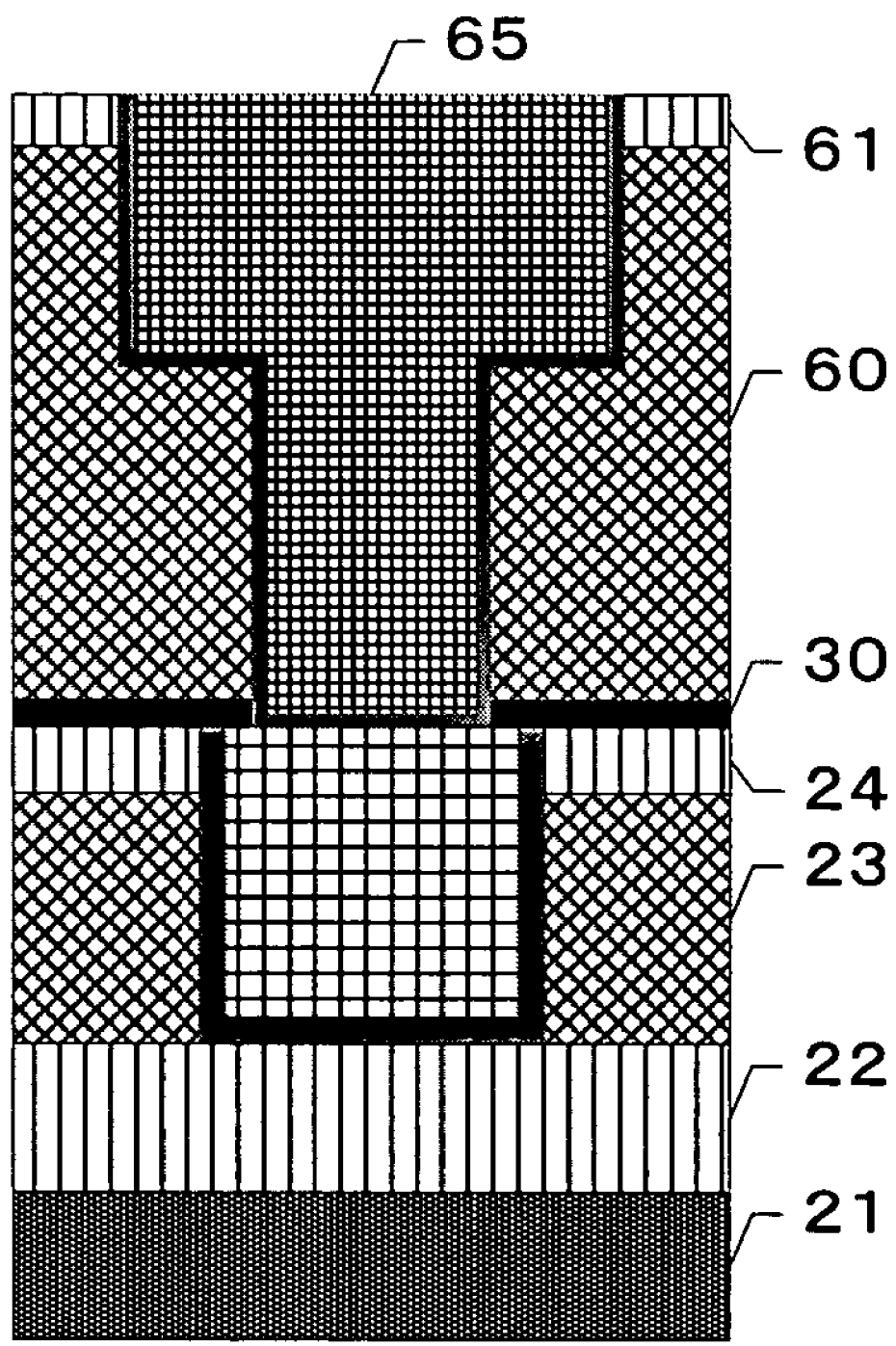

Subsequently, as shown in FIG. 8(J), the copper film 65 is polished by the CMP method to leave the copper film 65 only in the wiring trench in the second wiring layer and the contact via hole. A copper film (the upper half of the copper film 65) in the wiring trench in the second wiring layer is used as a wiring and a copper film (the lower half of the copper film 65) left in the contact via hole is used as a plug.

As described above, even if the organic insulating film 60 is formed in place of the silicon dioxide film 31 and the organic insulating film 32, the occurrence of a thickness reduction and bowing can be prevented by etching the silicon nitride films 30 and 62 before etching the organic insulating film 60. As a result, an increase in capacitance between wirings caused by thickness reduction or bowing can be prevented.

Moreover, a deposit which contains $CF_x$ and which is formed as a result of etching the silicon nitride films 30 and 62 can be removed and a copper oxide can be deoxidized to copper. Therefore, a yield rate can be raised.

In addition, by preventing the occurrence of bowing, the appearance of a discontinuous growth area can be prevented. As a result, a short of a wiring caused by the diffusion of copper from the copper film 65 can be forestalled.

A third embodiment of the present invention will now be described with reference to FIGS. 9(A) through 9(O).

Figure 9C:
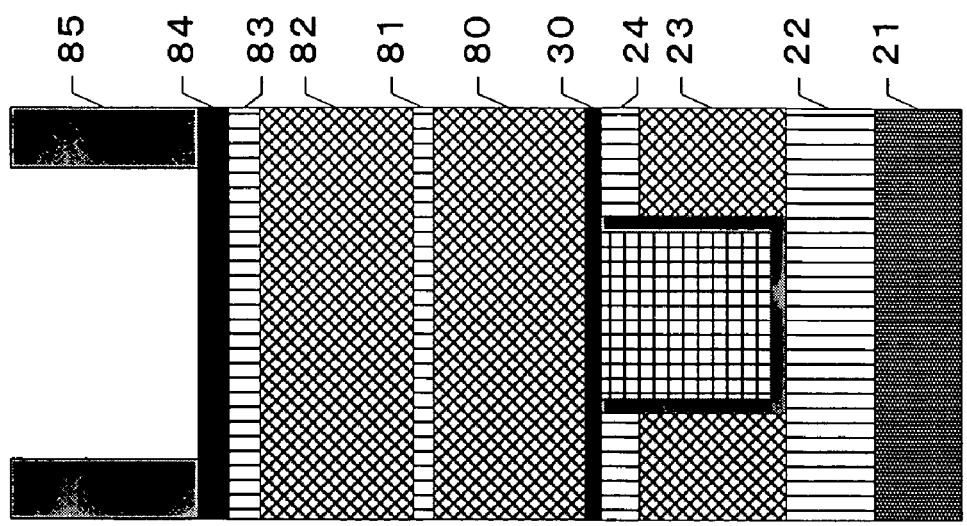
FIGS. 9(A) through 9(O) are views for describing a method for fabricating a semiconductor device, according to a third embodiment of the present invention.
Figure 9B:
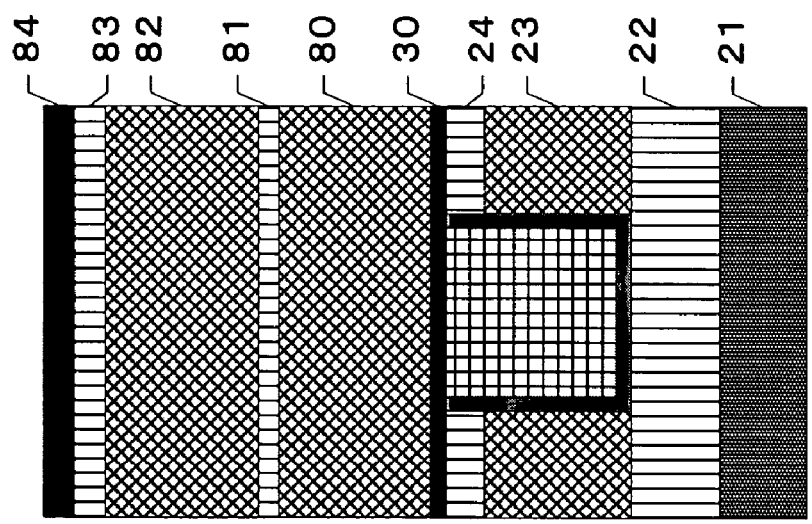
Figure 9A:
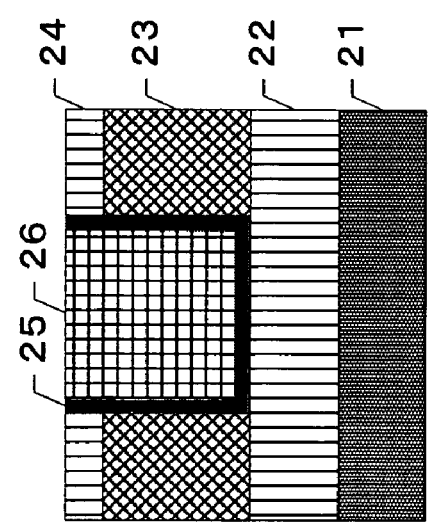

As shown in FIGS. 9(A) through 9(C), a plurality of films, such as insulating and metal films, are formed first on a lower wiring layer. A method for forming the lower wiring layer shown in FIG. 9(A) is the same as the conventional method, so descriptions of it will be omitted.

As shown in FIG. 9(B), the plurality of films, such as insulating and metal films, described below are formed on a copper film 26 and a silicon dioxide film 24 in the following way. That is to say, a silicon nitride film 30 with a thickness of 50 nm is formed on the copper film 26 and the silicon dioxide film 24 by a plasma CVD method. An organic insulating film 80 with a thickness of 400 nm is formed on the silicon nitride film 30 by the use of an insulating material, such as SiLK, by a spin coat method.

Then a silicon dioxide film 81 with a thickness of 100 nm is formed on the organic insulating film 80 by the plasma CVD method. An organic insulating film 82 with a thickness of 400 nm is formed on the silicon dioxide film 81 by the spin coat method. In this case, an insulating material, such as SiLK, is used. This is the same with the organic insulating film 80.

Then a silicon dioxide film 83 with a thickness of 100 nm is formed on the organic insulating film 82 by the plasma CVD method. A silicon nitride film 84 with a thickness of 100 nm is formed on the silicon dioxide film 83 by the plasma CVD method.

As shown in FIG. 9(C), after the formation of the above films, the silicon nitride film 84 is coated with a photoresist 85 and exposure and development are performed on the photoresist 85 to form a window.

Figure 9D:
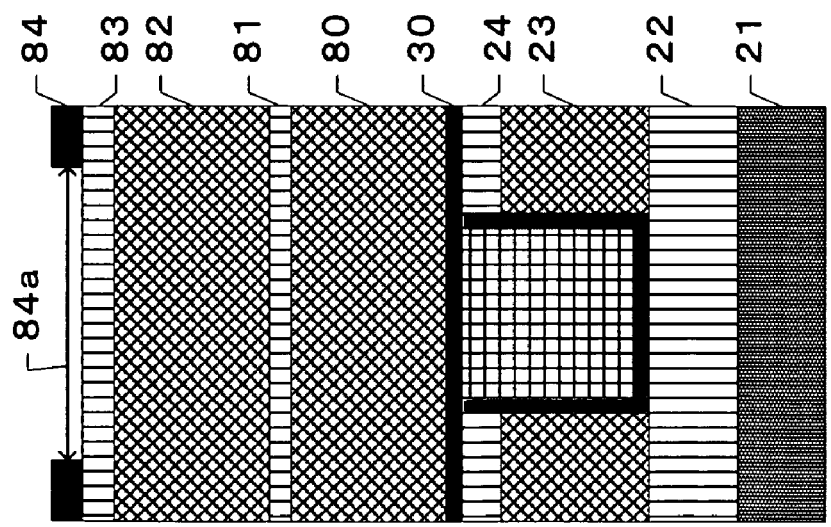

As shown in FIG. 9(D), an opening 84a for a wiring having a shape corresponding to a second wiring layer is made in the silicon nitride film 84 by a photolithographic method in which the photoresist 85 is used as a mask. The photoresist 85 is ashed by oxygen plasma and is removed.

Figure 9E:
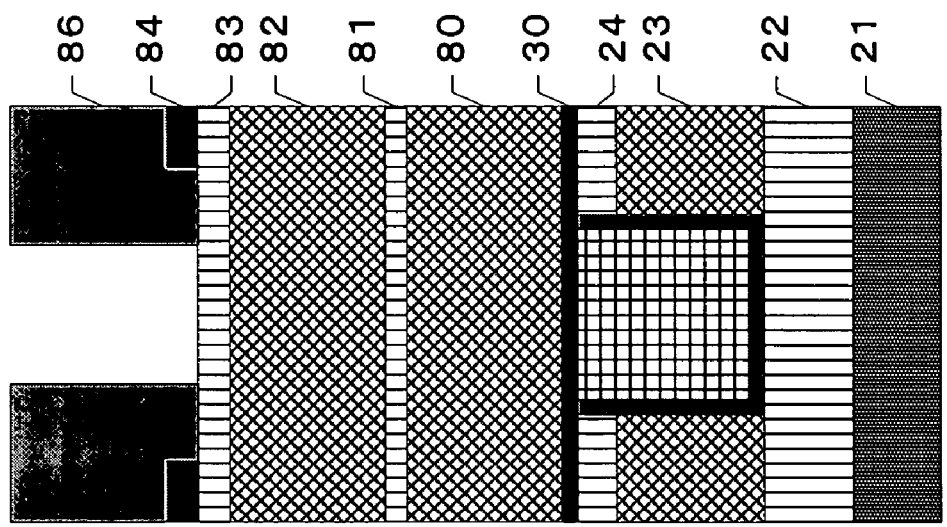
Figure 9F:
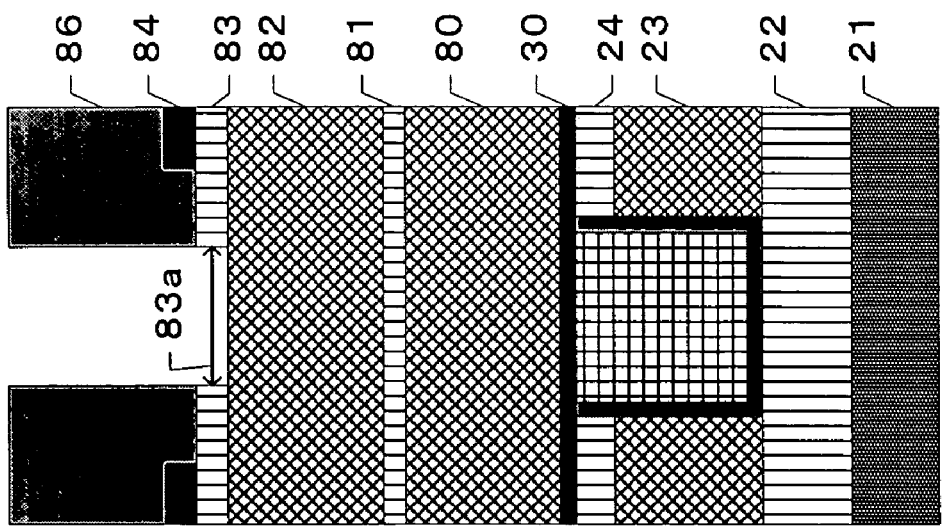

As shown in FIG. 9(E), then the surface of the silicon nitride film 84 and the inside of the opening 84a are coated with a photoresist 86. The photoresist 86 should be thicker than the photoresist 36 shown in FIG. 12(E). After the surface of the silicon nitride film 84 and the inside of the opening 84a are coated with the photoresist 86, exposure and development are performed on the photoresist film 86 to form a window, which is in the opening 84a for a wiring and which is opposite to part of a first wiring layer, in the photoresist film 86. This window has a shape corresponding to a contact via. As shown in FIG. 9(F), then the silicon dioxide film 83 is etched through the window in the photoresist film 86 to make an opening 83a having a shape corresponding to the contact via.

Figure 9I:
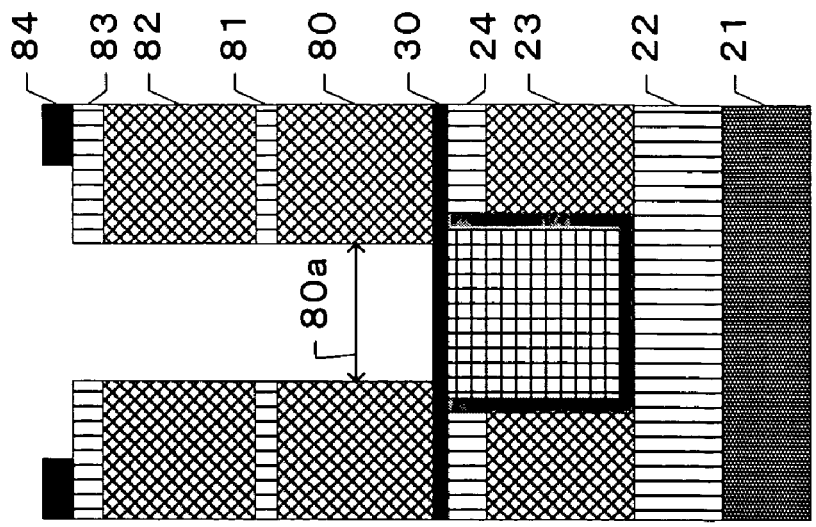
Figure 9H:
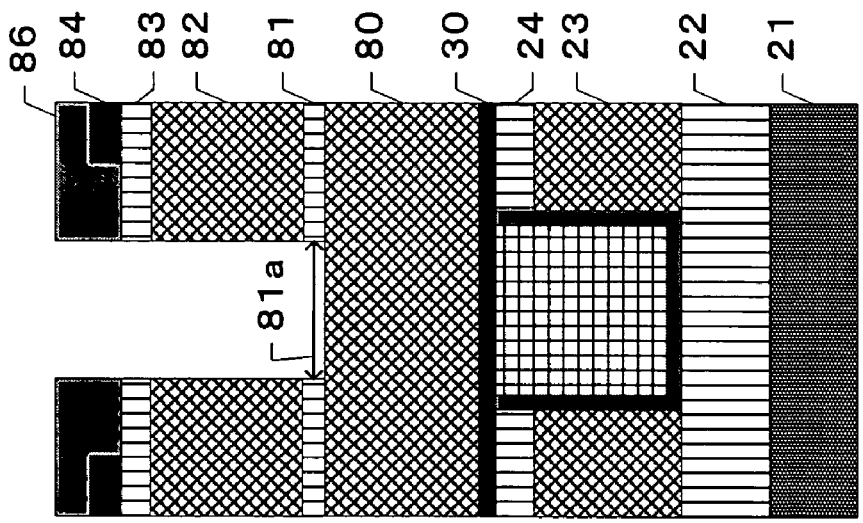
Figure 9G:
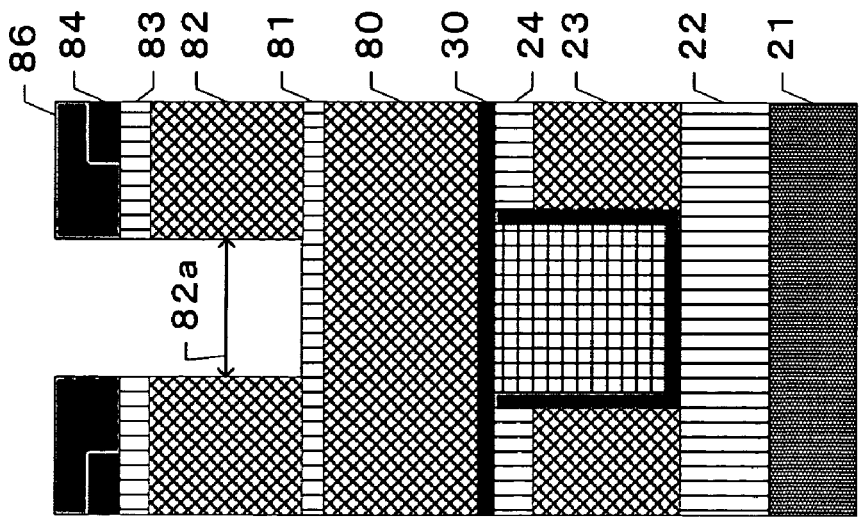

As shown in FIG. 9(G), anisotropic plasma etching with oxygen and argon is performed on the organic insulating film 82 through the opening 83a after the above etching to form an opening 82a there. By performing this etching, the photoresist film 86 is also etched. As stated above, however, the photoresist film 86 is thicker than the photoresist 36 shown in FIG. 12(E), so only part of it is removed.

Subsequently, as shown in FIG. 9(H), the silicon dioxide film 81 is etched into the shape of a wiring through the opening 82a by plasma etching using gas which contains fluorine with the remaining photoresist film 86 as a mask to make an opening 81a.

As shown in FIG. 9(I), then anisotropic plasma etching with oxygen and argon is performed on the organic insulating film 80 through the openings 81a and 82a to form an opening 80a there. By performing this etching, the photoresist film 86 is also etched and is removed.

Figure 9L:
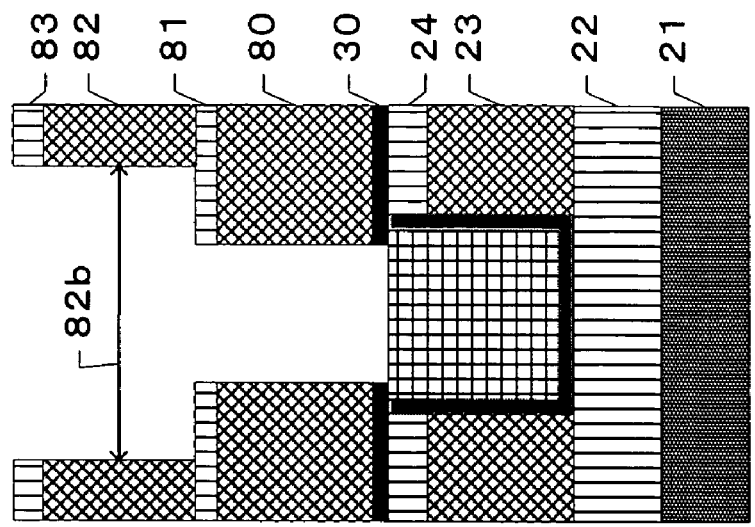
Figure 9K:
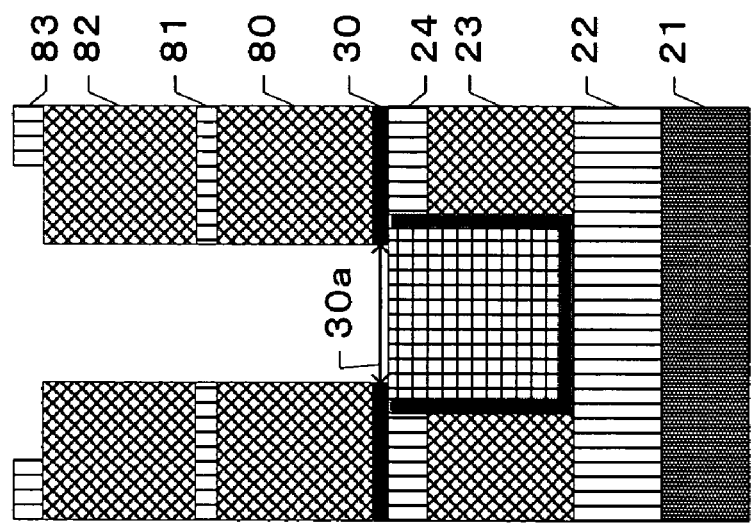
Figure 9J:
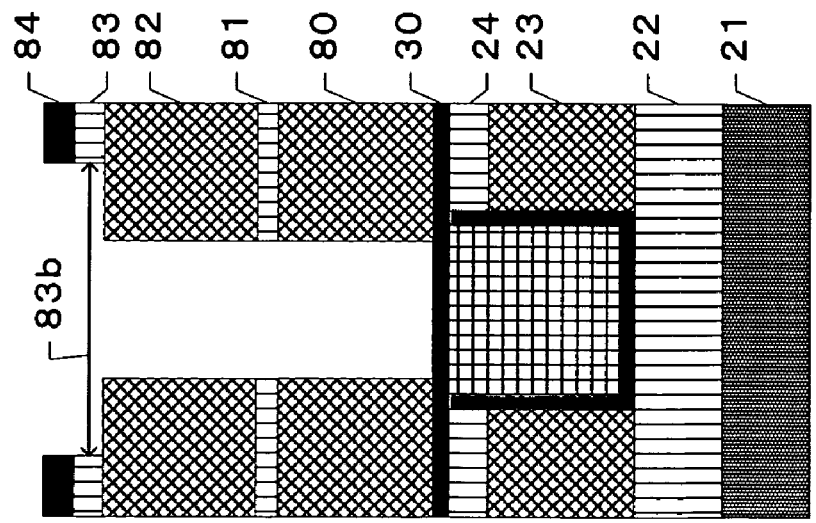

Subsequently, as shown in FIG. 9(J), the silicon dioxide film 83 is etched into the shape of the wiring through the opening 84a in the silicon nitride film 84 by plasma etching using gas which contains fluorine to make an opening 83b.

Subsequently, as shown in FIG. 9(K), plasma etching is performed on the silicon nitride film 30 beneath the opening 80a by the use of $C_4F_8$ gas and $O_2$ gas with the organic insulating film 80 as a mask to make an opening 30a there. The opening 30a in the silicon nitride film 30 and the opening 80a in the organic insulating film 80 are used as a contact via hole and part of wirings on the first wiring layer will get exposed in the bottom of the contact via hole.

As shown in FIG. 9(L), then the organic insulating film 82 is etched into the shape of the wiring through the opening 83b in the silicon dioxide film 83 by hydrogen or oxygen plasma. As a result, an opening 82b for a wiring shown in FIG. 9(L) is made there. The opening 82b for a wiring in the organic insulating film 82, together with the opening 83b for a wiring in the silicon dioxide film 83, will be used as a wiring trench in the second wiring layer.

In the third embodiment, the organic insulating film 82 is etched after the silicon nitride films 30 and 84 are etched. This prevents the occurrence of bowing. Moreover, the silicon dioxide film 81 is formed beneath the organic insulating film 82, so the occurrence of a thickness reduction can be prevented. In the process shown in FIG. 9(K), a deposit which contains $CF_x$ will be formed and a copper oxide will be formed on the copper film 26. By performing plasma etching by the use of oxygen gas or hydrogen gas in the process shown in FIG. 9(L), however, the deposit which contains $CF_x$ can be converted into a volatile gas and be removed. In addition, by performing etching by the use of hydrogen gas, the copper oxide can be deoxidized to copper.

Figure 9O:
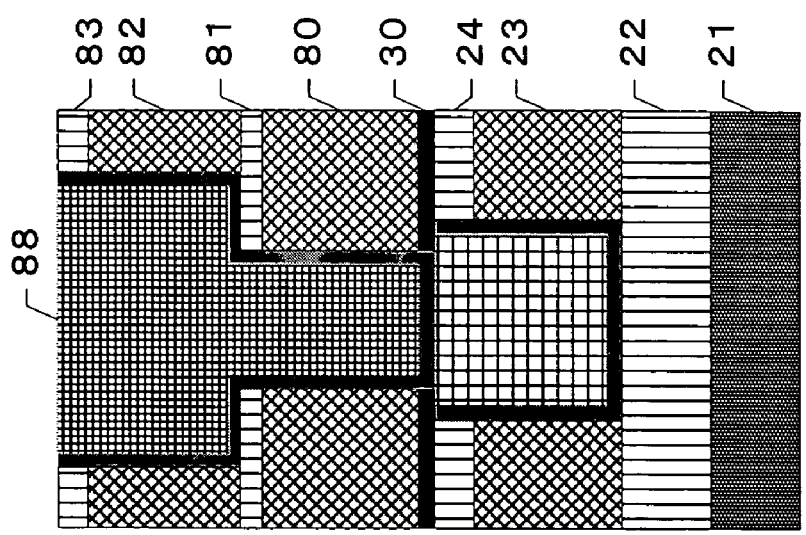
Figure 9N:
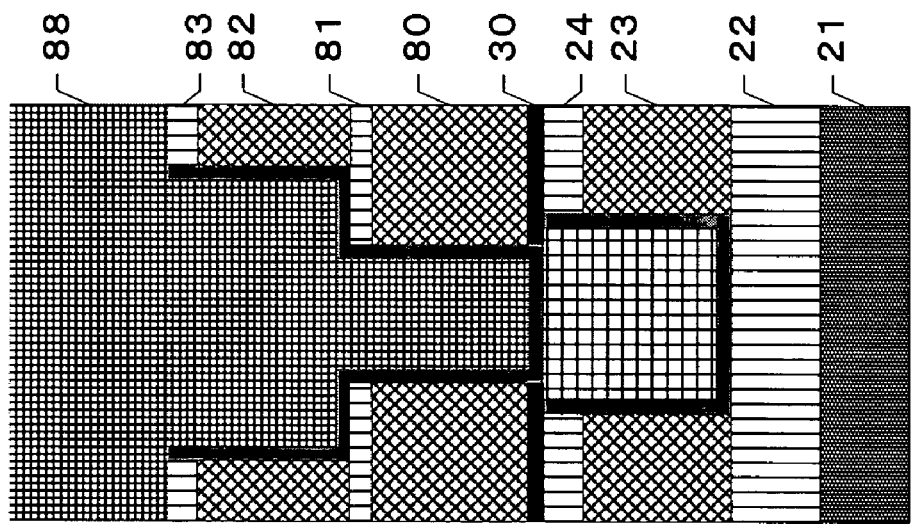
Figure 9M:
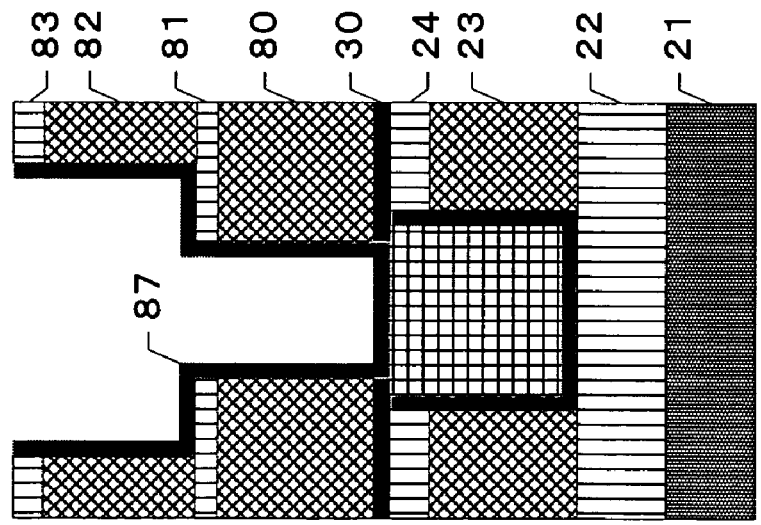

As shown in FIG. 9(M), a barrier metal film 87 of TiN or TaN with a thickness of 50 nm is formed by sputtering on the inner wall of a concave portion formed in the above way. As shown in FIG. 9(N), then the lower half of a copper film 88 with a thickness of 100 nm is formed by sputtering and the upper half of the copper film 88 with a thickness of 1,500 nm is formed on it by an electroplating method. Then anneal treatment is performed on the copper film 88 at 400° C. in an atmosphere of hydrogen for thirty minutes. As stated above, this anneal treatment is performed in order to improve the reliability of wirings by growing particles in the copper film 88.

Subsequently, as shown in FIG. 9(O), the copper film 88 is polished by a CMP method to leave the copper film 88 only in the wiring trench in the second wiring layer and the contact via hole. A copper film (the upper half of the copper film 88) in the wiring trench in the second wiring layer is used as a wiring and a copper film (the lower half of the copper film 88) left in the contact via hole is used as a plug.

As described above, even if the organic insulating film 80, the silicon dioxide film 81, and the organic insulating film 82 are formed in place of the silicon dioxide film 31 and the organic insulating film 32, the occurrence of a thickness reduction and bowing can be prevented by etching the silicon nitride films 30 and 84 before etching the organic insulating film 82. Moreover, a deposit which contains $CF_x$ and which is formed as a result of etching the silicon nitride films 30 and 84 can be removed and a copper oxide can be deoxidized to copper. Accordingly, an increase in capacitance between wirings caused by bowing or thickness reduction can be prevented and a yield rate can be raised.

In the above first through third embodiments silicon nitride (the silicon nitride films 30, 34, 62, and 84) is used, but silicon carbide (SiC) may be used instead.

As shown in FIG. 8(A), in the second embodiment the silicon nitride film 62 is formed on the silicon dioxide film 61. As shown in FIG. 10(A), however, a silicon dioxide film 61 may be formed on a silicon nitride film 62.

Figure 10B:
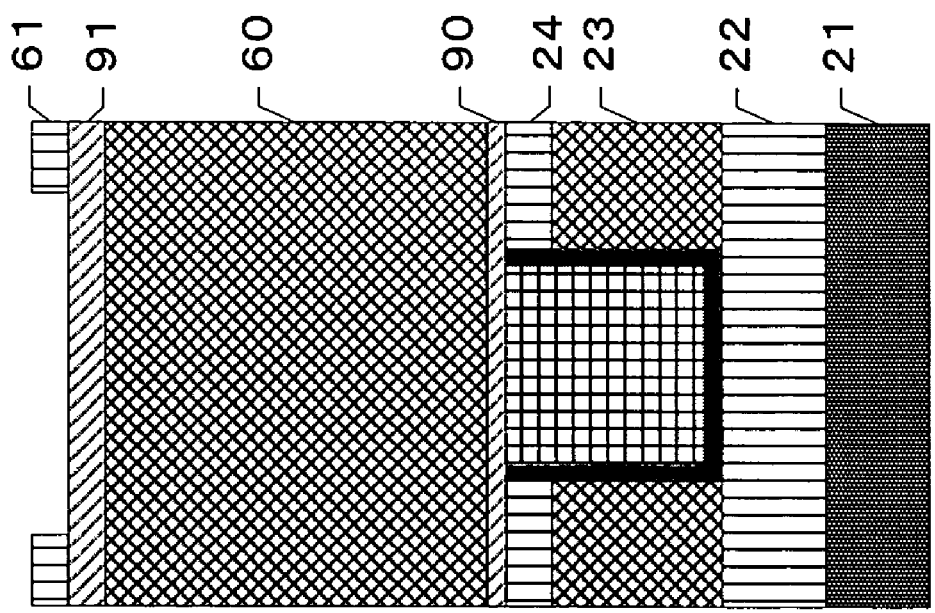
FIGS. 10(A) and 10(B) show another modification of the second embodiment of the present invention.
Figure 10A:
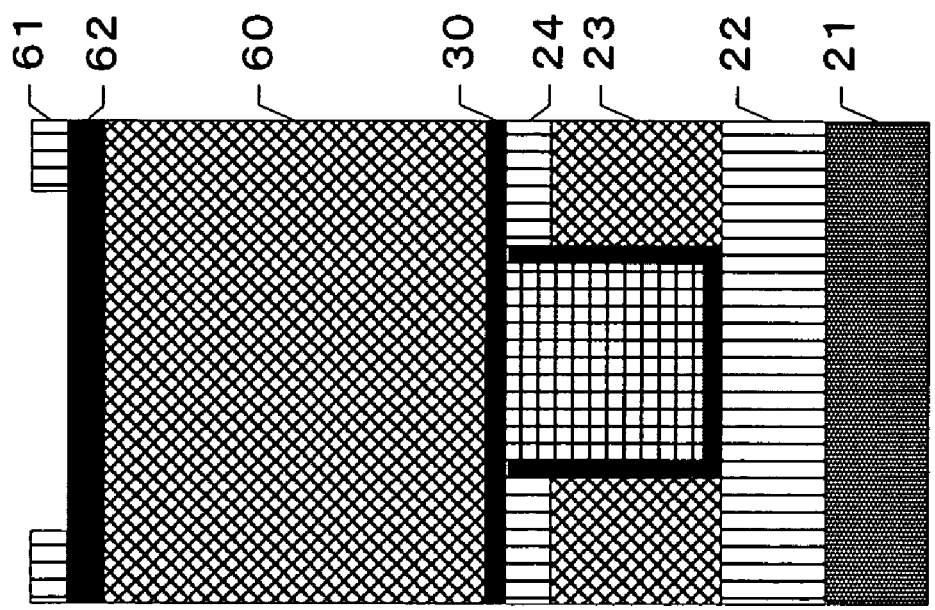

Furthermore, as shown in FIG. 10(B), silicon carbide (SiC) films 90 and 91 may be used in place of the silicon nitride films 30 and 62, respectively, shown in FIG. 10(A).

Figure 11:
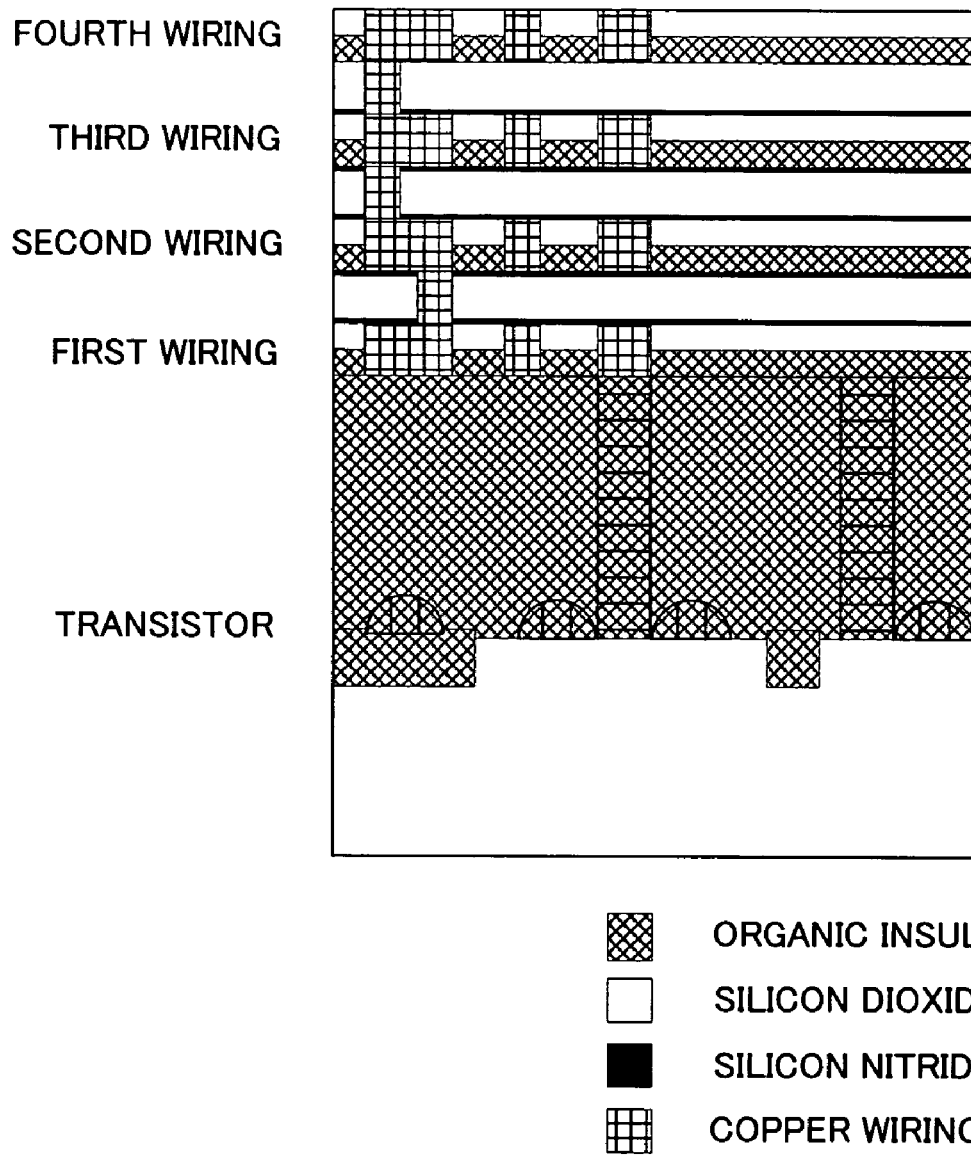
FIG. 11 is a sectional view of a device fabricated by using the method according to the first embodiment of the present invention.

FIG. 11 is a sectional view of a device fabricated by using the method according to the first embodiment of the present invention. In the first embodiment the method for forming the first and second wirings is shown. Wirings having a multilayer structure can be formed by repeating processes which are the same as those described above. By doing so, third and fourth wirings shown in FIG. 11 can be formed.

The same applies to the second and third embodiments. That is to say, wirings having a multilayer structure can be formed by repeating the above processes.

As described above, the method for fabricating a semiconductor device according to the present invention comprises: a process for forming a cap film, a first insulating film, an organic insulating film, a second insulating film and a mask film in order on a semiconductor substrate; a process for making a first opening of a wiring shaped pattern by etching part of the mask film; a process for making a second opening of a hole shaped pattern by etching part of the second insulating film which overlaps with the first opening; a process for making a third opening of the hole shaped pattern in the organic insulating film by etching the organic insulating film through the second opening in the second insulating film; a process for making a fourth opening of the wiring shaped pattern in the second insulating film by etching the second insulating film through the first opening in the mask film, and for making a fifth opening of the hole shaped pattern in the first insulating film by etching the first insulating film through the third opening in the organic insulating film; a process for making a sixth opening of the hole shaped pattern in the cap film by etching the cap film through the fifth opening in the first insulating film to use the sixth opening and the fifth opening as a via hole, and for removing the mask film; a process for making a seventh opening of the wiring shaped pattern in the organic insulating film by etching the organic insulating film through the fourth opening in the second insulating film to use the seventh opening and the fourth opening as a wiring trench; and a process for forming a via in the via hole and a wiring in the wiring trench by embedding a conductor in the via hole and the wiring trench at the same time. Therefore, the occurrence of bowing and a thickness reduction can be prevented.

Furthermore, as described above, the method for fabricating a semiconductor device according to the present invention comprises: a process for forming a cap film, an organic insulating film, an insulating film and a mask film in order on a semiconductor substrate; a process for making a first opening of a wiring shaped pattern by etching part of the mask film; a process for making a second opening of a hole shaped pattern by etching part of the insulating film which overlaps with the first opening; a process for making a third opening of the hole shaped pattern in the organic insulating film by etching the organic insulating film through the second opening in the insulating film; a process for making a fourth opening of the wiring shaped pattern in the insulating film by etching the insulating film through the first opening in the mask film; a process for making a fifth opening of the hole shaped pattern in the cap film by etching the cap film through the third opening in the organic insulating film to use the fifth opening and the third opening as a via hole, and for removing the mask film; a process for making a sixth opening of the wiring shaped pattern in the organic insulating film by etching the organic insulating film through the fourth opening in the insulating film to use the sixth opening and the fourth opening as a wiring trench; and a process for forming a via in the via hole and a wiring in the wiring trench by embedding a conductor in the via hole and the wiring trench at the same time. Therefore, a yield rate can be raised.

In addition, as described above, the method for fabricating a semiconductor device according to the present invention comprises: a process for forming a cap film, a first organic insulating film, a first insulating film, a second organic insulating film, a second insulating film and a mask film in order on a semiconductor substrate; a process for making a first opening of a wiring shaped pattern by etching part of the mask film; a process for making a second opening of a hole shaped pattern by etching part of the second insulating film which overlaps with the first opening; a process for making a third opening of the hole shaped pattern in the second organic insulating film by etching the second organic insulating film through the second opening in the second insulating film; a process for making a fourth opening of the hole shaped pattern in the first insulating film by etching the first insulating film through the third opening in the second organic insulating film; a process for making a fifth opening of the hole shaped pattern in the first organic insulating film by etching the first organic insulating film through the fourth opening in the first insulating film; a process for making a sixth opening of the wiring shaped pattern in the second insulating film by etching the second insulating film through the first opening in the mask film; a process for making a seventh opening of the hole shaped pattern in the cap film by etching the cap film through the fifth opening in the first organic insulating film to use the seventh opening, the fourth opening, and the fifth opening as a via hole, and for removing the mask film; a process for making an eighth opening of the wiring shaped pattern in the second organic insulating film by etching the second organic insulating film through the sixth opening in the second insulating film to use the eighth opening and the sixth opening as a wiring trench; and a process for forming a via in the via hole and a wiring in the wiring trench by embedding a conductor in the via hole and the wiring trench at the same time. Therefore, an increase in capacitance between wirings and a short of a wiring can be prevented.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for fabricating a semiconductor device, the method comprising:
 a process for forming a cap film, a first insulating film, an organic insulating film, a second insulating film and a mask film in order on a semiconductor substrate;
 a process for making a first opening of a wiring shaped pattern by etching part of the mask film;
 a process for making a second opening of a hole shaped pattern by etching part of the second insulating film which overlaps with the first opening;
 a process for making a third opening of the hole shaped pattern in the organic insulating film by etching the organic insulating film through the second opening in the second insulating film;
 a process for making a fourth opening of the wiring shaped pattern in the second insulating film by etching the second insulating film through the first opening in the mask film, and for making a fifth opening of the hole shaped pattern in the first insulating film by etching the first insulating film through the third opening in the organic insulating film;
 a process for making a sixth opening of the hole shaped pattern in the cap film by etching the cap film through the fifth opening in the first insulating film to use the sixth opening and the fifth opening as a via hole, and for removing the mask film;
 a process for making a seventh opening of the wiring shaped pattern in the organic insulating film by etching the organic insulating film through the fourth opening in the second insulating film to use the seventh opening and the fourth opening as a wiring trench; and
 a process for forming a via in the via hole and a wiring in the wiring trench by embedding a conductor in the via hole and the wiring trench at the same time.

2. The method for fabricating a semiconductor device according to claim 1, wherein the seventh opening is formed by plasma etching with hydrogen ($H_2$) gas, ammonia ($NH_3$) gas, or a mixed gas which contains hydrogen gas and ammonia gas.

3. The method for fabricating a semiconductor device according to claim 1, wherein the relation $W1 \geq W2$ holds, where W2 is the maximum distance between side walls of the seventh opening made in the organic insulating film and W1 is the maximum distance between side walls of the fourth opening made in the second insulating film.

4. The method for fabricating a semiconductor device according to claim 3, wherein the relation $(W2-W1)/2 \leq 10$ nm holds between the W1 and the W2.

5. The method for fabricating a semiconductor device according to claim 1, wherein the mask film and the cap film are formed by the use of silicon nitride or silicon carbide.

6. The method for fabricating a semiconductor device according to claim 1, wherein the organic insulating film is formed by the use of a polymer which contains hydrocarbon or arylether, organic SOG, inorganic SOG, or silicon oxycarbide (SiOC).

7. A method for fabricating a semiconductor device, the method comprising:
 a process for forming a cap film, an organic insulating film, an insulating film and a mask film in order on a semiconductor substrate;
 a process for making a first opening of a wiring shaped pattern by etching part of the mask film;
 a process for making a second opening of a hole shaped pattern by etching part of the insulating film which overlaps with the first opening;
 a process for making a third opening of the hole shaped pattern in the organic insulating film by etching the organic insulating film through the second opening in the insulating film;
 a process for making a fourth opening of the wiring shaped pattern in the insulating film by etching the insulating film through the first opening in the mask film;
 a process for making a fifth opening of the hole shaped pattern in the cap film by etching the cap film through the third opening in the organic insulating film to use the fifth opening and the third opening as a via hole, and for removing the mask film;
 a process for making a sixth opening of the wiring shaped pattern in the organic insulating film by etching the organic insulating film through the fourth opening in the insulating film to use the sixth opening and the fourth opening as a wiring trench; and
 a process for forming a via in the via hole and a wiring in the wiring trench by embedding a conductor in the via hole and the wiring trench at the same time.

8. The method for fabricating a semiconductor device according to claim 7, wherein the sixth opening is formed by plasma etching with hydrogen ($H_2$) gas or ammonia ($NH_3$) gas.

9. The method for fabricating a semiconductor device according to claim 7, wherein the relation $W1 \geq W2$ holds, where W2 is the maximum distance between side walls of the sixth opening made in the organic insulating film and W1 is the maximum distance between side walls of the fourth opening made in the insulating film.

10. The method for fabricating a semiconductor device according to claim 8, wherein the relation $(W2-W1)/2 \leq 10$ nm holds between the W1 and the W2.

11. The method for fabricating a semiconductor device according to claim 7, wherein the mask film and the cap film are formed by the use of silicon nitride or silicon carbide.

12. The method for fabricating a semiconductor device according to claim 7, wherein the organic insulating film is formed by the use of a polymer which contains hydrocarbon or arylether, organic SOG, inorganic SOG, or silicon oxycarbide (SiOC).

13. A method for fabricating a semiconductor device, the method comprising:
 a process for forming a cap film, a first organic insulating film, a first insulating film, a second organic insulating film, a second insulating film and a mask film in order on a semiconductor substrate;
 a process for making a first opening of a wiring shaped pattern by etching part of the mask film;
 a process for making a second opening of a hole shaped pattern by etching part of the second insulating film which overlaps with the first opening;
 a process for making a third opening of the hole shaped pattern in the second organic insulating film by etching the second organic insulating film through the second opening in the second insulating film;

a process for making a fourth opening of the hole shaped pattern in the first insulating film by etching the first insulating film through the third opening in the second organic insulating film;

a process for making a fifth opening of the hole shaped pattern in the first organic insulating film by etching the first organic insulating film through the fourth opening in the first insulating film;

a process for making a sixth opening of the wiring shaped pattern in the second insulating film by etching the second insulating film through the first opening in the mask film;

a process for making a seventh opening of the hole shaped pattern in the cap film by etching the cap film through the fifth opening in the first organic insulating film to use the seventh opening, the fourth opening, and the fifth opening as a via hole, and for removing the mask film;

a process for making an eighth opening of the wiring shaped pattern in the second organic insulating film by etching the second organic insulating film through the sixth opening in the second insulating film to use the eighth opening and the sixth opening as a wiring trench; and a process for forming a via in the via hole and a wiring in the wiring trench by embedding a conductor in the via hole and the wiring trench at the same time.

14. The method for fabricating a semiconductor device according to claim 13, wherein the eighth opening is formed by plasma etching with hydrogen ($H_2$) gas or ammonia ($NH_3$) gas.

15. The method for fabricating a semiconductor device according to claim 13, wherein the relation $$W1 \geq W2$$

holds, where W2 is the maximum distance between side walls of the eighth opening made in the second organic insulating film and W1 is the maximum distance between side walls of the sixth opening made in the second insulating film.

16. The method for fabricating a semiconductor device according to claim 15, wherein the relation $$(W2-W1)/2 \leq 10 \text{ nm}$$

holds between the W1 and the W2.

17. The method for fabricating a semiconductor device according to claim 13, wherein the mask film and the cap film are formed by the use of silicon nitride or silicon carbide.

18. The method for fabricating a semiconductor device according to claim 13, wherein the first organic insulating film and the second organic insulating film are formed by the use of a polymer which contains hydrocarbon or arylether, organic SOG, inorganic SOG, or silicon oxycarbide (SiOC).

19. A method for fabricating a semiconductor device including a lamination of a copper layer and a cap film on which an organic insulating film is formed, the method comprising:

a process for exposing the cap film by selectively removing the organic insulating film and by making an opening;

a process forming a window in a bottom of which the copper layer gets exposed by selectively removing the cap film through the opening; and a process for forming a wiring trench, after forming the window, by selectively removing the organic insulating film by the use of hydrogen plasma or oxygen plasma.

20. The method for fabricating a semiconductor device according to claim 19, wherein the cap film is formed by the use of silicon nitride.

21. The method for fabricating a semiconductor device according to claim 19, wherein the process for forming the window is performed by plasma etching using gas which contains fluorine.

22. The method for fabricating a semiconductor device according to claim 20, wherein the process for forming the window is performed by plasma etching using gas which contains fluorine.

\* \* \* \* \*